(12) United States Patent
Sekiguchi

(10) Patent No.: US 9,087,935 B2
(45) Date of Patent: Jul. 21, 2015

(54) DETECTOR HAVING A SCHOTTKY BARRIER PORTION AND A BARRIER PORTION HAVING A RECTIFYING PROPERTY

(75) Inventor: Ryota Sekiguchi, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 851 days.

(21) Appl. No.: 12/997,863

(22) PCT Filed: Jul. 27, 2009

(86) PCT No.: PCT/JP2009/063705
§ 371 (c)(1),
(2), (4) Date: Dec. 13, 2010

(87) PCT Pub. No.: WO2010/016445
PCT Pub. Date: Feb. 11, 2010

(65) Prior Publication Data
US 2011/0089516 A1    Apr. 21, 2011

(30) Foreign Application Priority Data

Aug. 6, 2008 (JP) ................ 2008-203089
Jun. 30, 2009 (JP) ................ 2009-154447

(51) Int. Cl.
*H01L 29/47* (2006.01)
*H01L 31/0224* (2006.01)
(Continued)

(52) U.S. Cl.
CPC .... *H01L 31/022408* (2013.01); *H01L 27/0727* (2013.01); *H01L 29/47* (2013.01); *H01L 31/0304* (2013.01); *H01L 31/1085* (2013.01); *H01L 31/11* (2013.01); *Y02E 10/544* (2013.01)

(58) Field of Classification Search
CPC .............. H01L 29/47; H01L 29/66143; H01L 29/7806; H01L 29/782; H01L 29/872; H01L 31/022408; H01L 31/1085; H01L 31/11
USPC .................. 257/114, 184, 425, 658, E27.009, 257/E29.113, E45.001, E25.002, E21.358, 257/E31.001, E31.052–E31.068; 438/7, 10, 438/16–17, 54, 57, 73–74, 308
See application file for complete search history.

(56) References Cited

U.S. PATENT DOCUMENTS 3,541,403 A * 11/1970 Sze et al. ............. 257/484
4,200,473 A * 4/1980 Carlson .............. 136/255
(Continued)

FOREIGN PATENT DOCUMENTS

EP       0272885 A2   6/1988
GB       2097584 A    11/1982
(Continued)

OTHER PUBLICATIONS

Chinese Office Action dated Feb. 27, 2013 issued in corresponding Chinese Patent Application No. 200980129467.3.
(Continued)

*Primary Examiner* — William F Kraig
*Assistant Examiner* — Maliheh Malek
(74) *Attorney, Agent, or Firm* — Fitzpatrick, Cella, Harper & Scinto

(57) ABSTRACT

Provided is a rectifier such as a detector in which a cutoff frequency may be increased in a view point different from the reduction in size of the structure. The rectifier includes: a Schottky barrier portion including a Schottky electrode; a barrier portion having a rectifying property with respect to a majority carrier in the Schottky barrier portion; and an ohmic electrode in electrical contact with the barrier portion having the rectifying property, in which each of the Schottky barrier portion and the barrier portion having the rectifying property has an asymmetrical band profile whose gradient on one side is larger than a gradient of another side, and the Schottky barrier portion and the barrier portion having the rectifying property are connected to each other so that the steep gradient side of the band profile is located on a side of the Schottky electrode.

11 Claims, 12 Drawing Sheets

(51) Int. Cl.
*H01L 27/07* (2006.01)
*H01L 31/0304* (2006.01)
*H01L 31/108* (2006.01)
*H01L 31/11* (2006.01)
*H01L 31/101* (2006.01)

(56) References Cited

U.S. PATENT DOCUMENTS

| | | | |
|---|---|---|---|
| 4,292,092 A * | 9/1981 | Hanak | 438/74 |
| 4,353,081 A * | 10/1982 | Allyn et al. | 257/191 |
| 4,410,902 A * | 10/1983 | Malik | 257/498 |
| 4,415,760 A * | 11/1983 | Madan | 136/258 |
| 4,449,140 A * | 5/1984 | Board | 257/107 |
| 4,539,581 A * | 9/1985 | Malik et al. | 257/6 |
| 4,667,211 A | 5/1987 | Iafrate et al. | |
| 4,682,196 A * | 7/1987 | Sakai et al. | 257/458 |
| 4,839,709 A * | 6/1989 | Zurakowski | 329/370 |
| 4,855,797 A * | 8/1989 | Kohn et al. | 257/20 |
| 4,999,694 A * | 3/1991 | Austin et al. | 257/188 |
| 5,049,955 A * | 9/1991 | Freeouf et al. | 257/26 |
| 5,081,513 A * | 1/1992 | Jackson et al. | 257/57 |
| 5,115,294 A * | 5/1992 | Sudbo et al. | 257/187 |
| 5,279,162 A * | 1/1994 | Takebe et al. | 73/726 |
| 5,432,374 A | 7/1995 | Norton | |
| 5,548,139 A * | 8/1996 | Ando | 257/192 |
| 5,760,427 A * | 6/1998 | Onda | 257/194 |
| 6,013,950 A * | 1/2000 | Nasby | 257/734 |
| 6,211,531 B1 * | 4/2001 | Nakazato et al. | 257/28 |
| 6,278,055 B1 * | 8/2001 | Forrest et al. | 136/263 |
| 6,740,908 B1 * | 5/2004 | Giboney | 257/185 |
| 6,831,309 B2 * | 12/2004 | Giboney | 257/184 |
| 6,861,718 B2 * | 3/2005 | Sato et al. | 257/423 |
| 6,949,774 B2 * | 9/2005 | Parikh et al. | 257/104 |
| 7,368,762 B2 * | 5/2008 | Tennant et al. | 257/184 |
| 7,386,024 B2 | 6/2008 | Sekiguchi et al. | |
| 7,463,104 B2 | 12/2008 | Sekiguchi et al. | |
| 7,684,455 B2 | 3/2010 | Ouchi et al. | |
| 7,709,797 B2 | 5/2010 | Sekiguchi et al. | |
| 7,755,108 B2 * | 7/2010 | Kuraguchi | 257/199 |
| 7,869,036 B2 | 1/2011 | Kajiki et al. | |
| 7,889,015 B2 | 2/2011 | Sekiguchi et al. | |
| 7,924,107 B2 | 4/2011 | Koyama et al. | |
| 7,928,471 B2 * | 4/2011 | Mastro et al. | 257/184 |
| 7,933,305 B2 | 4/2011 | Ouchi et al. | |
| 2004/0119129 A1 * | 6/2004 | Giboney | 257/458 |
| 2004/0169184 A1 * | 9/2004 | Udagawa et al. | 257/86 |
| 2004/0217375 A1 * | 11/2004 | Yokogawa et al. | 257/192 |
| 2004/0235215 A1 * | 11/2004 | Komori | 438/57 |
| 2005/0012113 A1 * | 1/2005 | Sheu et al. | 257/184 |
| 2005/0127380 A1 * | 6/2005 | Kawasaki et al. | 257/84 |
| 2005/0173728 A1 * | 8/2005 | Saxler | 257/192 |
| 2006/0000974 A1 * | 1/2006 | Brouns | 250/338.1 |
| 2007/0096239 A1 * | 5/2007 | Cao et al. | 257/458 |
| 2007/0145390 A1 * | 6/2007 | Kuraguchi | 257/94 |
| 2008/0277647 A1 * | 11/2008 | Kouvetakis et al. | 257/19 |
| 2008/0308143 A1 * | 12/2008 | Atanackovic | 136/255 |
| 2010/0117059 A1 * | 5/2010 | Chrastina et al. | 257/19 |
| 2011/0031579 A1 * | 2/2011 | Parikh et al. | 257/473 |
| 2011/0193057 A1 * | 8/2011 | Sabathil et al. | 257/13 |
| 2011/0215245 A1 * | 9/2011 | Ouchi | 250/338.4 |
| 2014/0042457 A1 * | 2/2014 | Shibata et al. | 257/76 |
| 2014/0124885 A1 * | 5/2014 | Sekiguchi et al. | 257/428 |

FOREIGN PATENT DOCUMENTS

| | | |
|---|---|---|
| JP | 9162424 A | 6/1997 |
| WO | 2008/073469 A1 | 6/2008 |

OTHER PUBLICATIONS

U.S. Appl. No. 13/071,222, filed Mar. 24, 2011. Applicant: Sekiguchi.
Korean Office Action dated Apr. 27, 2012 issued in corresponding Korean Patent Application No. 10-2011-7004926.
European Office Action dated Aug. 8, 2011 issued in corresponding European Patent Application No. 09788011.6.
Lee, et al., The Fabrication and Performance of Planar Doped Barrier Diodes as 200 GHz Subharmonically Pumped Mixers, IEEE Transactions on Microwave Theory and Techniques, vol. 42, No. 4, pp. 742-749, Apr. 1994.
Korean Office Action dated Nov. 13, 2012 issue in corresponding Korean Patent Application No. 10-2011-7004926.
Lee, et al., The Fabrication and Performance of Planar Doped Barrier Diodes as 200 GHz Subharmonically Pumped Mixers, vol. 42, No. 4, pp. 742-748 (1994).
Dickens, Spreading Resistance as a Function of Frequency, IEEE Transactions on Microwave Theory and Techniques, vol. MTT-15, No. 2, pp. 101-109 (1967).
Brown, et al., Advances in Schottky Rectifier Performance, IEEE Microwave Magazine, vol. 8, pp. 54-59 (2007).
Chen, et al., Electrical Characteristics of Nearly Relaxed InAs/GaP Heterojunctions, Appl. Phys. Lett. vol. 70, No. 12, pp. 1551-1553 (1997).
International Preliminary Report on Patentability dated Feb. 17, 2011 in corresponding PCT Patent Application No. PCT/JP2009/063705.

\* cited by examiner

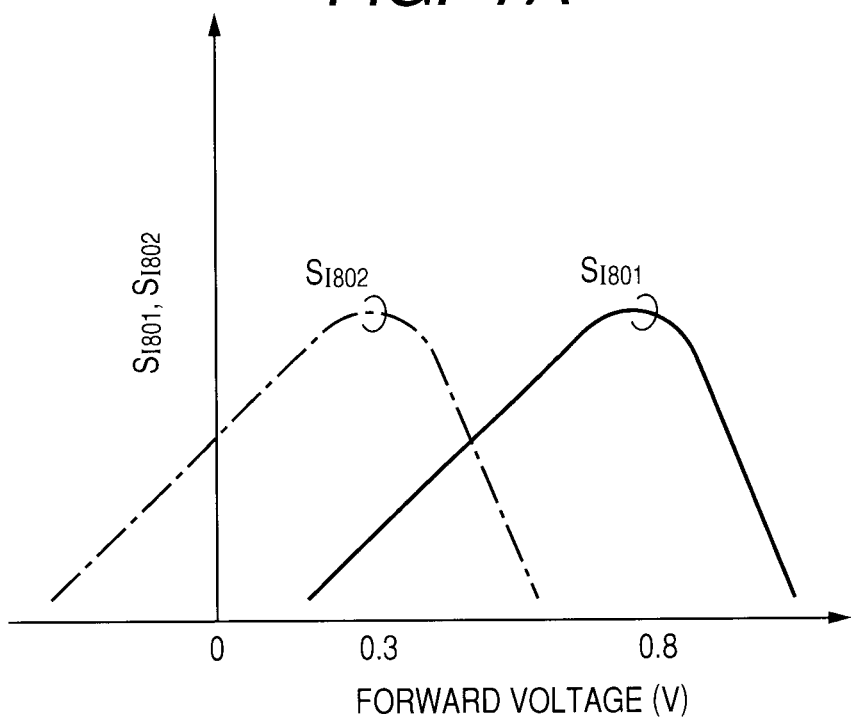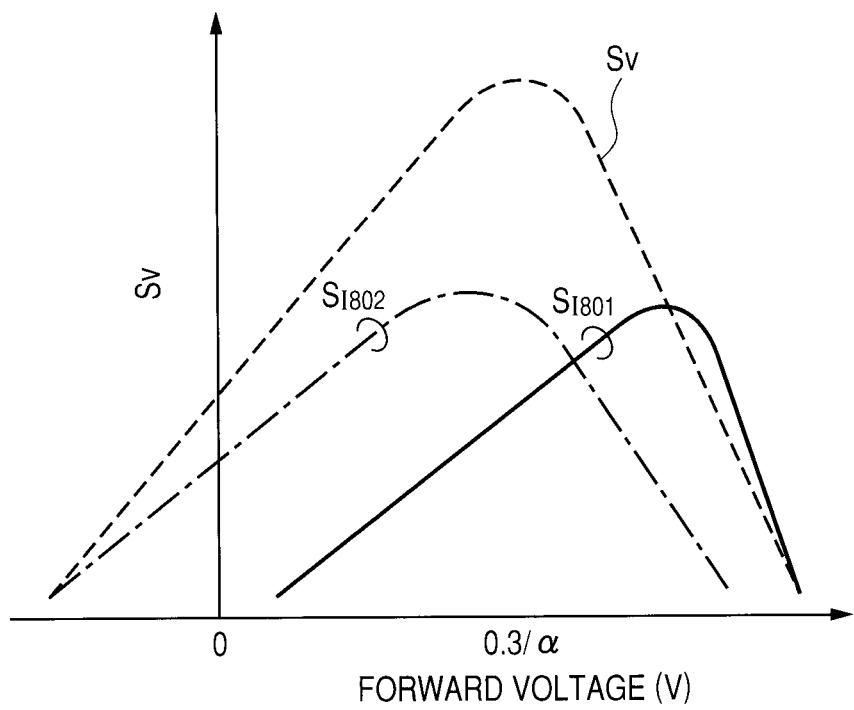

DETECTOR HAVING A SCHOTTKY BARRIER PORTION AND A BARRIER PORTION HAVING A RECTIFYING PROPERTY

TECHNICAL FIELD

The present invention relates to a rectifier such as an electromagnetic wave detection device, and more particularly, to an electromagnetic wave detection device and a rectifier for a frequency band ranging from a millimeter wave band to a terahertz wave band (equal to or more than 30 GHz and equal to or less than 30 THz), and an apparatus using the electromagnetic wave detection device or the rectifier.

BACKGROUND ART

Up to now, a thermal detection device and a quantum detection device have been known as electromagnetic wave detection devices for a frequency band ranging from a millimeter wave band to a terahertz wave band (equal to or more than 30 GHz and equal to or less than 30 THz). Examples of the thermal detection device include a microbolometer (a-$S_1$ or $VO_x$), a pyroelectric device ($LiTaO_3$ or TGS), and a Golay cell. The above-mentioned thermal detection device converts, into heat, a change in property which is caused by an electromagnetic wave energy, and then converts a change in temperature into a thermoelectromotive force or a resistance to detect the change in property. The thermal detection device does not necessarily require cooling but has a relatively slow response because of heat exchange. Examples of the quantum detection device include an intrinsic semiconductor device (such as MCT(HgCdTe) photoconduction device) and an extrinsic semiconductor device. The quantum detection device captures an electromagnetic wave as a photon and detects a photoelectromotive force of a semiconductor having a small band gap or a change in resistance thereof. The quantum detection device has a relatively quick response but requires cooling because thermal energy at room temperature in the frequency range cannot be neglected.

In recent years, an electromagnetic wave detection device using a rectifier for the frequency band ranging from the millimeter wave band to the terahertz wave band (equal to or more than 30 GHz and equal to or less than 30 THz) has been developed as a detector which has a relatively quick response and does not require cooling. The detector captures an electromagnetic wave as a high-frequency electrical signal and detects the high-frequency electrical signal which is received from an antenna and rectified by the rectifier. According to such a system, as the frequency band becomes higher, the detection is normally more difficult. This is because, as the frequency band becomes higher, filter effects caused in all portions of the detector cannot be neglected. Therefore, in many cases, there is employed a system in which the antenna is directly coupled to a rectifier having a microstructure to suppress the filter effects.

Japanese Patent Application Laid-Open No. H09-162424 discloses the detector as described above. The rectifier is a Schottky barrier diode having a Schottky electrode area set to 0.0007 $\mu m^2$ (0.03 $\mu m$ in diameter) by micro-machining, which detect an electromagnetic wave of approximately 28 THz (10.6 $\mu m$ in wavelength) by a $CO_2$ laser. It is known that the Schottky barrier diode is provided with an Rc low-pass filter having a junction capacitance Cj in a Schottky barrier and a series resistance Rs. The junction capacitance Cj is proportional to the Schottky electrode area. Therefore, the simplest method of increasing a cutoff frequency fc $(=(2\pi \times RsCj)^{-1})$ may be a reduction in Schottky electrode area. Such a relationship of a typical Schottky barrier diode is calculated as follows. When the Schottky electrode area is set to 1 $\mu m^2$ (approximately 1 $\mu m$ in diameter) by micro-machining, fc is estimated to be approximately 300 GHz. When the Schottky electrode area is set to 0.1 $\mu m^2$ (approximately 0.3 $\mu m$ in diameter) which is $\frac{1}{10}$ of above by micro-machining, fc is estimated to be approximately 3 THz. When the Schottky electrode area is set to 0.01 $\mu m^2$ (approximately 0.1 $\mu m$ in diameter) which is $\frac{1}{10}$ of above by micro-machining, fc is estimated to be approximately 30 THz.

SUMMARY OF THE INVENTION

However, the method of increasing the cutoff frequency by using the microstructure in the conventional detector including the Schottky barrier diode has the following problems.

A first problem is that a high-precision micro-machining technology is required to form the sub-micron or nano structure. That is, stabilization of characteristics, an improvement in yield rate, and a reduction in cost are necessary, and hence a method merely depending only on micro-machining is not desirable.

A second problem is that the series resistance increases as a size of the structure reduces. A resistance component called a spreading resistance is known as one of factors in increasing the series resistance in the sub-micron or nano structure. In the structure of the Schottky barrier diode, the spreading resistance is more likely to increase as the diameter of the Schottky electrode becomes smaller (see Dickens, IEEE Trans. Microwave Theory and Techniques, Vol. MTT-15, 101 (1967)). Therefore, the relationship between the Schottky electrode area and the cutoff frequency is not accurately estimated. In fact, the series resistance increases along with the reduction in size, thereby reducing the cutoff frequency. Thus, the reduction in size is further required, and hence there is a limitation on an increase of the cutoff frequency by the reduction in size of the structure.

In view of the above-mentioned circumstances, a detector according to the present invention includes: a Schottky barrier portion including a Schottky electrode; at least one barrier portion having a rectifying property with respect to a majority carrier in the Schottky barrier portion; and an ohmic electrode which is in electrical contact with the barrier portion having the rectifying property. The Schottky barrier portion is connected to the barrier portion having the rectifying property so that a direction of a detecting current flowing through the Schottky barrier portion is aligned with a detecting direction of a current flowing through the barrier portion having the rectifying property when an electric field component of an electromagnetic wave to be detected is induced between the Schottky electrode and the ohmic electrode.

Also in view of the above-mentioned circumstances, an image forming device according to the present invention includes: a plurality of the above-mentioned detectors, in which: the plurality of detectors are arranged in array; and the plurality of detectors detect electric fields of electromagnetic waves, based on which an electric field distribution image is formed.

Further, in view of the above-mentioned circumstances, a rectifier according to the present invention includes: a Schottky barrier portion including a Schottky electrode; a barrier portion having a rectifying property with respect to a majority carrier in the Schottky barrier portion; and an ohmic electrode which is in electrical contact with the rectifying barrier portion. Each of the Schottky barrier portion and the rectifying barrier portion has an asymmetrical band profile whose gradient on one side is larger than a gradient of another side. Further, the Schottky barrier portion and the rectifying barrier portion are connected to each other so that the large gradient side of the band profile is located on a side of the Schottky electrode.

An object of the present invention is to provide a detector or rectifier in which a cutoff frequency may be increased in a view point different from the view point of the reduction in size of the structure. That is, according to the present invention, the rectifying barrier portion and the Schottky barrier portion through which the same majority carrier continuously passes integrally serve as the rectifier. Therefore, according to the present invention, the method of increasing the cutoff frequency does not depend only on the reduction in size of the structure, and hence the detector may be manufactured by a micro-machining technology at lower precision than in a conventional case. It is unlikely to generate a series resistance, and hence an upper limit of the cutoff frequency may be increased higher than in a conventional case.

Further features of the present invention will become apparent from the following description of exemplary embodiments with reference to the attached drawings.

BRIEF DESCRIPTION OF THE DRAWINGS

FIGS. 7A and 7B illustrate relationships between detection responsibilities and applied electric fields (voltages) in the device according to Example 1.

DETAILED DESCRIPTION OF THE INVENTION

Figure 1A:
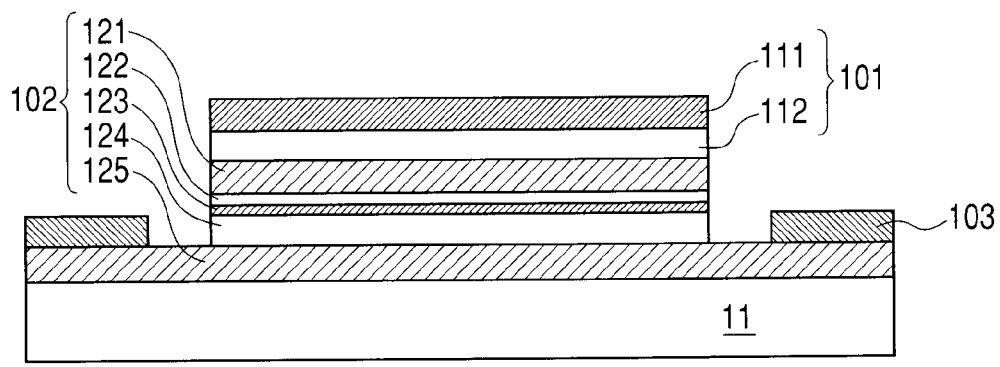
FIG. 1A is a structural view illustrating a device according to a first embodiment of the present invention.

Hereinafter, embodiments of the present invention are described with reference to the attached drawings.

Important points for a rectifier such as a detector according to the present invention are that a rectifying barrier and a Schottky barrier through which the same majority carriers continuously pass integrally serve as the rectifier, and that a Schottky electrode is used as a part of the rectifier. Based on this idea, a fundamental structure of the detector according to the embodiments of the present invention includes a Schottky barrier portion including a Schottky electrode, a rectifying barrier portion having a rectifying property with respect to a majority carrier in the Schottky barrier portion, and an ohmic electrode which is in electrical contact with the rectifying barrier portion. The Schottky barrier portion is connected to the rectifying barrier portion so that a direction of a detecting current flowing through the Schottky barrier portion is aligned with a direction of a detecting current flowing through the rectifying barrier portion when an electric field component of an electromagnetic wave to be detected is induced between the Schottky electrode and the ohmic electrode.

In the fundamental structure, as described below in a second embodiment, multiple rectifying barrier portions may be provided. In this case, the multiple rectifying barrier portions are connected to each other so that directions of detecting currents flowing through the respective rectifying barrier portions are aligned with each other when the electric field component of the electromagnetic wave to be detected is induced between the Schottky electrode and the ohmic electrode.

As described below in a third embodiment, the Schottky barrier portion may include one of a metal and a semi-metal for the Schottky electrode and a semiconductor which is substantially intrinsic to deplete the majority carrier (herein, also referred to as merely "substantially intrinsic") or a semiconductor which is intrinsic.

As described below in a first embodiment, the rectifying barrier portion may include a multilayer film structure in which a conductivity type semiconductor for providing the majority carrier, a semiconductor which is intrinsic or substantially intrinsic, a conductivity type semiconductor opposite to the conductivity type semiconductor, a semiconductor which is thicker than the semiconductor which is intrinsic or substantially intrinsic and which is intrinsic or substantially intrinsic, and a conductivity type semiconductor for providing the majority carrier, are provided in the stated order.

As described below in the third embodiment, the rectifying barrier portion may include a multilayer film structure in which a conductivity type semiconductor for providing the majority carrier, a semi-metal, a semiconductor which is intrinsic or substantially intrinsic, and a conductivity type semiconductor for providing the majority carrier, are provided in the stated order.

As described below in a fourth embodiment, the rectifying barrier portion may include a multilayer film structure in which a conductivity type semiconductor for providing the majority carrier, a semiconductor which has a band gap larger than a band gap of the conductivity type semiconductor and is intrinsic or substantially intrinsic, and a conductivity type semiconductor for providing the majority carrier, are provided in the stated order.

A transistor for generating a detecting signal may be further provided on the same substrate.

As described below in a fifth embodiment, there may be provided an antenna for inducing the electric field component of the electromagnetic wave to be detected between the Schottky electrode and the ohmic electrode. Herein, the Schottky electrode and the ohmic electrode are provided as output ports of the antenna.

Multiple detectors, each of which is the detector described above, may be arranged in array to realize an image forming device for forming an electric field distribution image based on electric fields (that is, electric field differences) of electromagnetic waves detected by the multiple detectors.

Further, a fundamental structure of the rectifier according to the embodiments of the present invention includes a Schottky barrier portion including a Schottky electrode, a rectifying barrier portion having a rectifying property with respect to a majority carrier in the Schottky barrier portion, and an ohmic electrode which is in electrical contact with the rectifying barrier portion. Each of the Schottky barrier portion and the rectifying barrier portion has an asymmetrical band profile in which one side is a steep gradient and the other side is a gentle gradient. The Schottky barrier portion and the rectifying barrier portion are connected to each other so that a steep gradient side of the band profile is located on a side of the Schottky electrode. The above-mentioned rectifier may be used as, for example, a detector.

According to the detector or the rectifier of the embodiments, a method of increasing a cutoff frequency does not depend only on a reduced size of the structure, and hence the detector or the rectifier may be manufactured by a micromachining technology with lower precision than that of a conventional case. In addition, a series resistance is difficult to be generated, and hence an upper limit of the cutoff frequency may be increased higher than that of a conventional case.

In the detector and the rectifier which have an increased cutoff frequency, a filter effect is reduced, even in, for example, a frequency band ranging from a millimeter wave band to a terahertz wave band (equal to or more than 30 GHz and equal to or less than 30 THz), and hence responsibility and noise equivalent power (NEP) are not easily increased. Therefore, it is possible to provide a device in which, in the frequency band, fundamental detection performance including the responsibility and the NEP is sufficient, a response is relatively quick, and cooling is not required. The device structure does not depend only on a Schottky barrier, and hence a necessary bias of a typical Schottky barrier diode may be reduced or desirably omitted. Thus, the detector is desirably configured so that a suitable operating point of responsibility is set to zero bias. In this case, it is likely to reduce noise generated by a bias current and realize a simplified structure which does not require a bias wiring.

The device having the effects as described above may be used as a high-responsibility detector for sensing or an array detector for imaging in the frequency band ranging from the millimeter wave band to the terahertz wave band (equal to or more than 30 GHz and equal to or less than 30 THz).

Hereinafter, the embodiments of the present invention are described with reference to the attached drawings.

First Embodiment

Figure 1B:
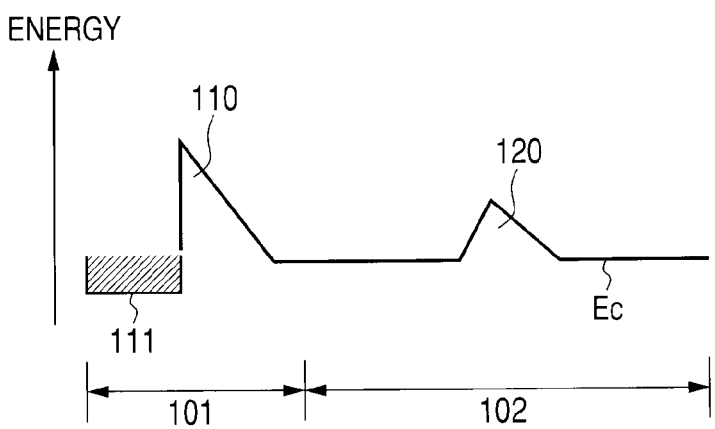
FIG. 1B illustrates a band profile of the device according to the first embodiment of the present invention.
Figure 1C:
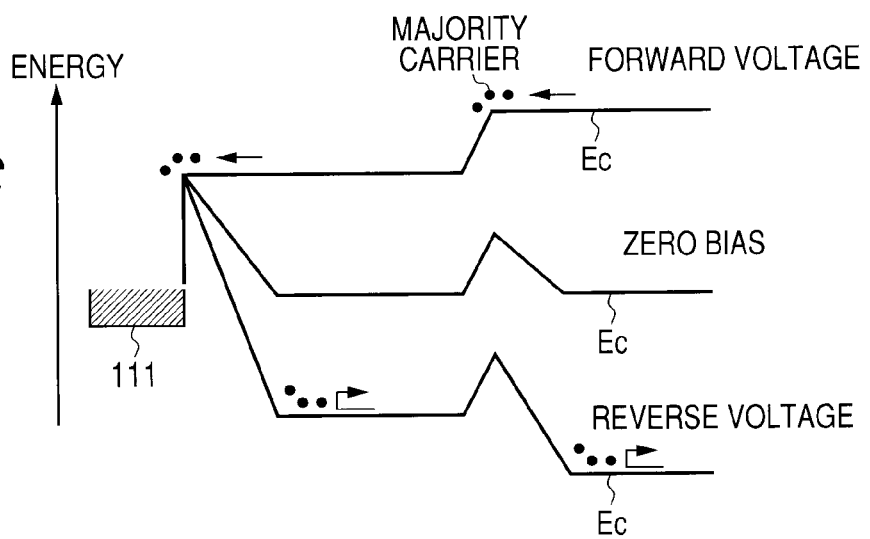
FIG. 1C illustrates a detecting current on the band profile, which flows in the device according to the first embodiment of the present invention.

FIGS. 1A to 1C illustrate a detector according to the first embodiment. FIG. 1A is a cross sectional view illustrating a structure of the device and FIG. 1B illustrates a part of a band profile in the structure of the device. In the device according to this embodiment, a Schottky barrier portion 101 including a Schottky electrode 111 is connected to a rectifying barrier portion 102 having a rectifying property. A Schottky barrier 110 illustrated in FIG. 1B is, for example, an energy barrier produced when a semiconductor 112 which is intrinsic or substantially intrinsic is connected to the Schottky electrode 111 made of metal. A barrier 120 having a rectifying property is, for example, an energy barrier produced by a multilayer film structure including semiconductors 121 to 125 provided in the stated order. The semiconductor 121 has a conductivity type for providing the same majority carriers. The semiconductor 122 is intrinsic or substantially intrinsic. The semiconductor 123 has a conductivity type opposite to that of the semiconductor 121. The semiconductor 124 is thicker than the semiconductor 122 and is intrinsic or substantially intrinsic. The semiconductor 125 has the same conductivity type as the semiconductor 121. In FIG. 1A, reference numeral 11 denotes a substrate.

The rectifying barrier portion 102 has a multilayer film structure called a planar doped barrier diode which is well known. Each of the energy barriers 110 and 120 has a structure through which majority carriers may first pass when an electric field in a certain direction is applied. That is, the majority carriers are emitted from the energy barriers 110 and 120 by the electric field in the certain direction (thermionic field emission), and hence the majority carriers may not tunnel through the energy barriers 110 and 120 by an electric field in a direction reverse to the certain direction. A structure of each of the energy barriers 110 and 120 has such a mechanism. The mechanism occurs when the number of majority carriers is sufficiently small in the semiconductors 112 and 124 which are included in the energy barriers and located on one side. A feature of the device according to this embodiment is a band profile in which the same majority carriers continuously pass through the rectifying barrier 120 and the Schottky barrier 110 only when the electric field in the certain direction is applied (referred to as forward voltage). Therefore, the Schottky barrier portion 101 is connected to the rectifying barrier portion 102 so that the same majority carriers continuously pass through the rectifying barrier portion 102 and the Schottky barrier portion 101 when the forward voltage is applied between the Schottky electrode 111 and an ohmic electrode 103. In other words, each of the energy barriers 110 and 120 has an asymmetrical band profile in which a gradient on one side larger than a gradient of the other side, and the large gradient side is located on the Schottky electrode 111 side.

The relations as described above are illustrated in FIG. 1C. As illustrated in FIG. 1C, a current flows in a direction with the forward voltage and a current does not flow with a reverse voltage. In this case, it is necessary to electrically connect the ohmic electrode 103 to the conductive semiconductor 125 of the rectifying barrier portion 102 which is located on a side opposed to the Schottky electrode 111. In the device according to this embodiment, when an electric field component of an electromagnetic wave to be detected is induced between the Schottky electrode 111 and the ohmic electrode 103, a current flows in a direction based on the mechanism described above. The current includes a frequency component equal in frequency to the electromagnetic wave to be detected but an effective value thereof is not zero, and hence the frequency component is a detecting current. Therefore, the device according to this embodiment is regarded as a so-called rectifier and thus may be used as a rectifying type detector.

A reason why the device to which the present invention may be applied has an effect of increasing the cutoff frequency is that the rectifying barrier 120 and the Schottky barrier 110 through which the same majority carriers continuously pass integrally serve as a rectifier. Therefore, an RC first order low-pass filter of the device according to this embodiment has a junction capacitance $Cj_{110}$ in the Schottky barrier 110, a junction capacitance $Cj_{120}$ in the rectifying barrier 120, and a series resistance Rs. With respect to a total junction capacitance Cj, $Cj^{-1}=(Cj_{110}^{-1}+Cj_{120}^{-1})$, and hence the total junction capacitance Cj of the device according to this embodiment may be suppressed to a value smaller compared with a Schottky barrier diode structure having the same Schottky electrode area, without exception. Note that when the Schottky electrode 111 is used as a part of the rectifier, a contact resistance at the Schottky electrode 111 does not become a component of the series resistance Rs.

RsCj can be reduced in this manner, and hence the device to which the present invention may be applied can have the effect of increasing the cutoff frequency. In other words, the area of the Schottky electrode 111 of the device to which the present invention may be applied can be increased to have a value larger compared with a Schottky barrier diode structure having the same junction capacitance Cj. Thus, according to the device of this embodiment, the method of increasing the cutoff frequency does not depend only on the reduced size of the structure, and hence the device may be manufactured by a micro-machining technology with lower precision than in a conventional case. For example, a spreading resistance in a sub-micron structure in which the Schottky electrode 111 is larger in diameter than a conventional Schottky electrode may be suppressed to a small value, and hence the cutoff frequency may be increased to a value equal to or larger than 30 THz. The device having an increased cutoff frequency as described above according to this embodiment is desirable as a detector for the frequency band ranging from the millimeter wave band to the terahertz wave band (equal to or more than 30 GHz and equal to or less than 30 THz). For example, the device according this embodiment may be used as a high-responsibility detector for sensing or an array detector for imaging.

Second Embodiment

A detector according to the second embodiment of the present invention is described with reference to FIGS. 2A to 2C.

Figure 2A:
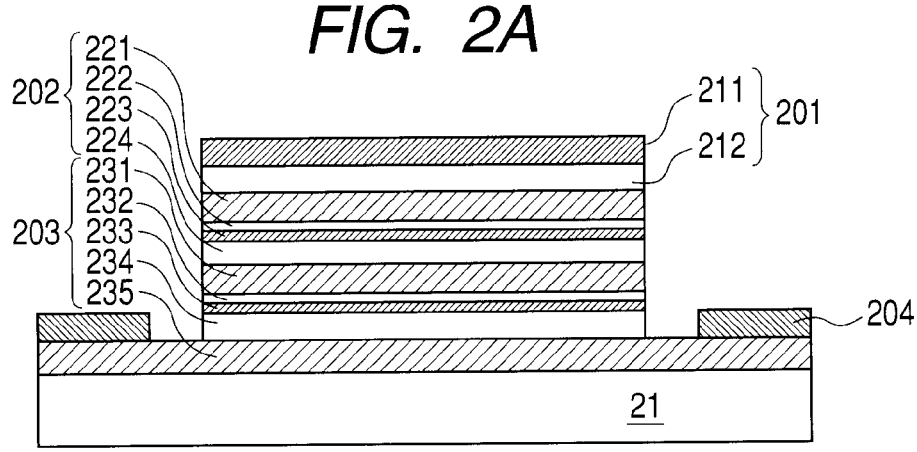
FIG. 2A is a structural view illustrating a device according to a second embodiment of the present invention.
Figure 2B:
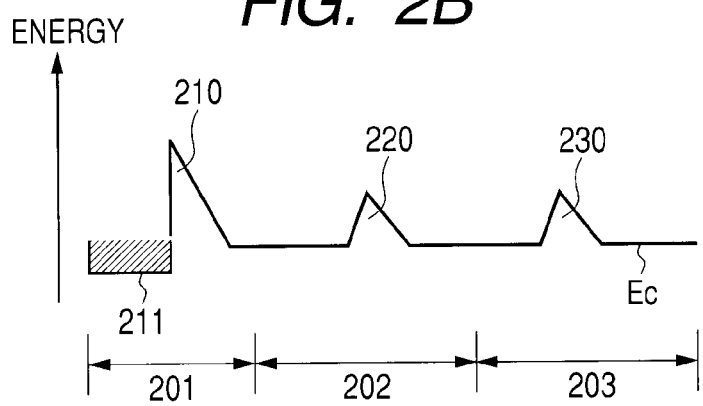
FIG. 2B illustrates a band profile of the device according to the second embodiment of the present invention.
Figure 2C:
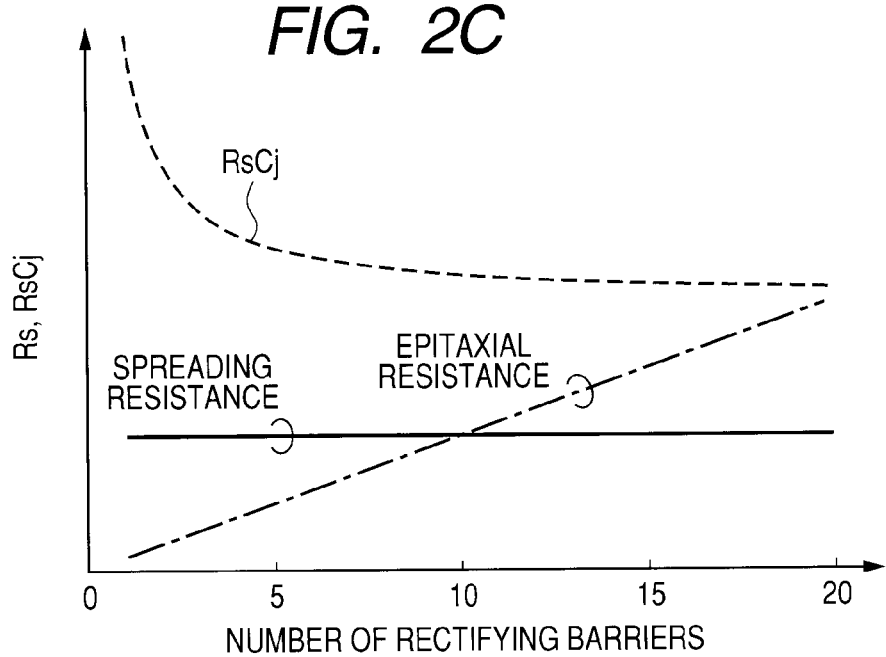
FIG. 2C illustrates a reason for increasing a cutoff frequency in the device according to the second embodiment of the present invention.

FIGS. 2A and 2B illustrate the detector according to this embodiment. FIG. 2A is a cross sectional view illustrating a structure of the detector and FIG. 2B illustrates a part of a band profile in the structure of the detector. A feature of the detector according to this embodiment is a band profile in which the same majority carriers continuously pass through multiple rectifying barriers 230 and 220 and a Schottky barrier 210 when the forward voltage is applied. Separate rectifying barrier portions 202 and 203 and a Schottky barrier portion 201 are connected to each other so that the same majority carriers continuously pass through the Schottky barrier portion 201 and the rectifying barrier portions 202 and 203 when the forward voltage is applied between a Schottky electrode 211 and an ohmic electrode 204. Therefore, the detector according to this embodiment is regarded as the so-called rectifier and thus may be used as the rectifying type detector.

In FIG. 2A, the detector includes a substrate 21, the ohmic electrode 204, a semiconductor 212 which is substantially intrinsic, a conductivity type semiconductor 221 for providing the majority carriers, a semiconductor 222 which is substantially intrinsic, a semiconductor 223 having an opposite conductivity type, and a semiconductor 224 which is substantially intrinsic. The detector further includes a conductivity type semiconductor 231 for providing the majority carriers, a semiconductor 232 which is substantially intrinsic, a semiconductor 233 having an opposite conductivity type, a semiconductor 234 which is substantially intrinsic, and a conductivity type semiconductor 235 for providing the majority carriers.

An RC first order low-pass filter of the detector according to this embodiment has a junction capacitance $Cj_{210}$ in the Schottky barrier 210, junction capacitances $Cj_{220}$ and $Cj_{230}$ in the separate rectifying barriers 220 and 230, and a series resistance Rs. With respect to a total junction capacitance Cj, $Cj^{-1}=(Cj_{210}^{-1}+Cj_{220}^{-1}+Cj_{230}^{-1})$ and hence the total junction capacitance Cj of the detector according to this embodiment may be suppressed to a value smaller than in a Schottky barrier diode structure having the same Schottky electrode area, without exception. The number of rectifying barrier portions may be arbitrary. The Schottky barrier portion 201 and the multiple rectifying barrier portions 202 and 203 are desirably connected to each other so that the same majority carriers continuously pass through the separate rectifying barrier portions when the forward voltage is applied between the Schottky electrode 211 and the ohmic electrode 204. The total junction capacitance Cj of the detector according to this embodiment may be suppressed to a value much smaller than in the case where the single rectifying barrier portion is provided.

When the number of rectifying barrier portions is too large, a resistance component of an epitaxial layer as one of factors of the series resistance cannot be neglected, and hence the effect of increasing the cutoff frequency saturates. The resistance of the epitaxial layer is produced at a connection portion between the separate rectifying barrier portions. Therefore, in a typical case, even when the resistance is small, the epitaxial resistance is proportional to the number of rectifying barrier portions. In contrast to this, the junction capacitance is inversely proportional to the number of rectifying barrier portions, and hence, when the number of rectifying barrier portions is too large, RsCj becomes a constant value. Thus, when the spreading resistance in the series resistance component is larger than the resistance of the epitaxial layer, a reduction effect of RsCj may be effective. For example, when the number of rectifying barrier portions in the sub-micron structure is small, the spreading resistance is larger than the epitaxial resistance. As is apparent from FIG. 2C illustrating the relationship, the effective number of rectifying barrier portions may be up to approximately 10. The detector in which cutoff frequency is increased as described above according to this embodiment is desirable as the detector for the frequency band ranging from the millimeter wave band to the terahertz wave band (equal to or more than 30 GHz and equal to or less than 30 THz).

Third Embodiment

A detector according to the third embodiment of the present invention is described with reference to FIG. 3A.

Figure 3A:
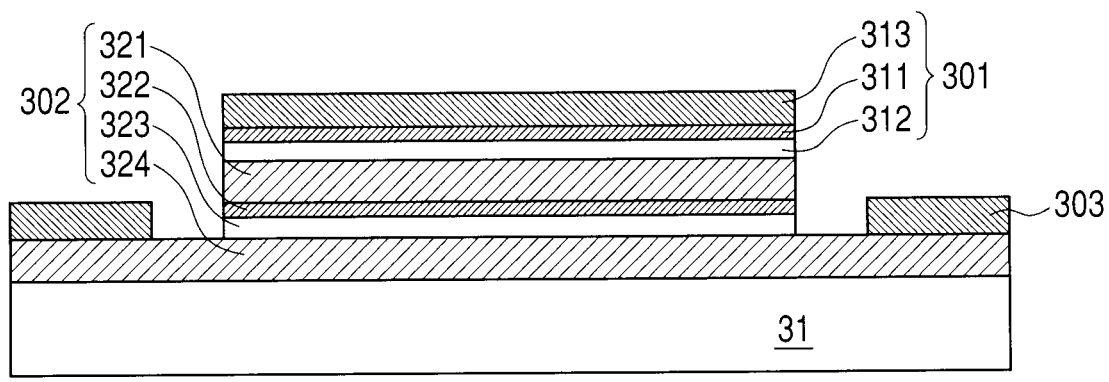
FIG. 3A is a structural view illustrating a device according to a third embodiment of the present invention.

FIG. 3A is a cross sectional view illustrating a structure of the detector according to this embodiment. In the detector according to this embodiment, a Schottky barrier portion 301 is connected to a rectifying barrier portion 302 so that the same majority carriers continuously pass through the rectifying barrier portion 302 and the Schottky barrier portion 301 when the forward voltage is applied between a Schottky electrode (semi-metal) 311 and an ohmic electrode 303. In the detector according to this embodiment, a Schottky barrier is, for example, an energy barrier produced when the semi-metal 311 is connected to a semiconductor 312 which is intrinsic or substantially intrinsic. The semi-metal 311 serving as the Schottky electrode has low conductivity by itself, and hence a metal 313 having high conductivity may be further provided.

The rectifying barrier may have, for example, the following multilayer film structure. The multilayer film structure includes a conductivity type semiconductor 321 for providing the same majority carriers as the majority carriers of the Schottky barrier portion 301, a semi-metal 322, a semiconductor 323 which is intrinsic or substantially intrinsic, and a semiconductor 324 having the same conductivity type as the semiconductor 321, which are provided in the stated order. Each of the barrier portions 301 and 302 has a multilayer film structure with a semi-metal/semiconductor junction and is disclosed in, for example, Brown et al., IEEE Microwave Magazine, Vol. 8, 54 (2007). Each of the semi-metals 311 and 322 is, for example, an ErAs thin film and has a lattice constant close to a lattice constant of GaAs substrate or an InP substrate in a case of NaCl structure. A GaAs system or an InP system (including InGaAs) is desirably selected as each of the semiconductors 312, 321, 323, and 324. Even in this embodiment, an energy barrier in the rectifying barrier portion 302 has a structure in which the majority carriers may pass only after the forward voltage is applied. Therefore, the structure of the detector according to this embodiment is also regarded as the so-called rectifier and thus may be used as the rectifying type detector. In FIG. 3A, reference numeral 31 denotes a substrate.

A total junction capacitance Cj of the detector according to this embodiment may be suppressed to a value smaller compared with a Schottky barrier diode structure having the same Schottky electrode area, without exception. According to the detector of this embodiment, the structure of the rectifying barrier portion may be selected from the multilayer film structures conventionally known. Even when any of the multilayer film structures is selected, the total junction capacitance Cj of the detector according to this embodiment may be suppressed to a value smaller compared with a Schottky barrier diode structure having the same Schottky electrode area, without exception. Therefore, the rectifying barrier portion of the detector to which the present invention may be applied is selected according to another additional purpose. According to a feature of the multilayer film structure (rectifying barrier portion 302) with the semi-metal/semiconductor junction of this embodiment, when a semiconductor composition is adjusted, a suitable operating point of responsibility may be designed. Thus, according to this embodiment, a zero-bias operation which is difficult in the Schottky barrier diode may be performed, and hence noise generated by a bias current may be reduced and a simplified structure which does not require a bias wiring may be realized.

Fourth Embodiment

A detector according to a fourth embodiment of the present invention is described with reference to FIG. 3B.

Figure 3B:
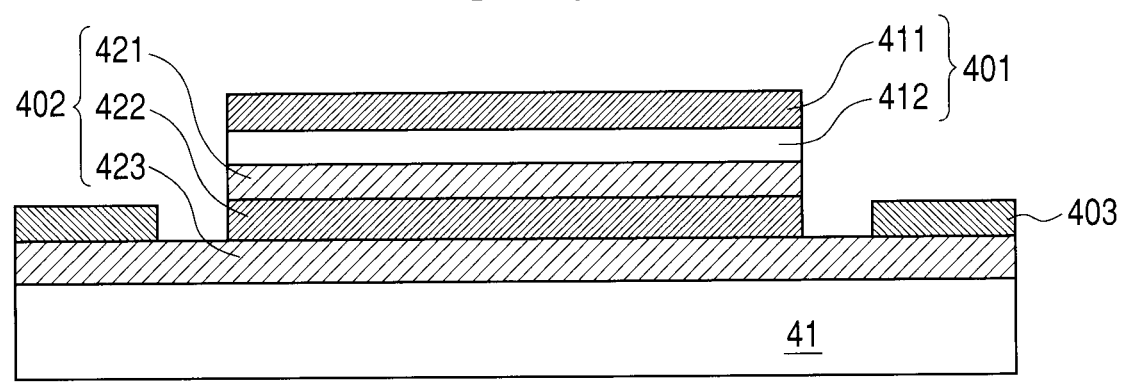
FIG. 3B is a structural view illustrating a device according to a fourth embodiment of the present invention.

FIG. 3B is a cross sectional view illustrating a structure of the detector according to this embodiment. In the detector according to this embodiment, a Schottky barrier portion 401 is connected to a rectifying barrier portion 402 so that the same majority carriers continuously pass through the rectifying barrier portion 402 and the Schottky barrier portion 401 when the forward voltage is applied between a Schottky electrode 411 and an ohmic electrode 403. In the detector according to this embodiment, the rectifying barrier may have, for example, the following multilayer film structure. The multilayer film structure includes a semiconductor 421 having a conductivity type for providing the same majority carriers as the majority carriers of the Schottky barrier portion 401, a semiconductor 422 which has a band gap larger than a band gap of the semiconductor 421 and is intrinsic or substantially intrinsic, and a semiconductor 423 having the same conductivity type as the semiconductor 421, which are provided in the stated order.

The rectifying barrier portion 402 has a multilayer film structure with a so-called semiconductor heterojunction and is discussed in, for example, Chen et al., Appl. Phys. Lett., Vol. 70, 1551 (1997). The semiconductor 422 with a large band gap is, for example, GaP, and the semiconductor 421 with a smaller band gap is, for example, InAs (thin film). A GaP system is desirably selected as each of the semiconductors 412 and 423. Also in this embodiment, an energy barrier in the rectifying barrier portion 402 has a structure through which the majority carriers may pass only after the forward voltage is applied. Therefore, the structure of the detector according to this embodiment is also regarded as the so-called rectifier and thus may be used as the rectifying type detector. In FIG. 3B, reference numeral 41 denotes a substrate.

A total junction capacitance Cj of the detector according to this embodiment may be suppressed to a value smaller than in a Schottky barrier diode structure having the same Schottky electrode area, without exception. Even in the case of the detector according to this embodiment, the structure of the rectifying barrier portion may be selected from the multilayer film structures known up to now. Even when any of the multilayer film structures is selected, the total junction capacitance Cj of the detector according to this embodiment may be suppressed to a value smaller than in a Schottky barrier diode structure having the same Schottky electrode area, without exception. Therefore, the rectifying barrier portion of the detector to which the present invention may be applied is selected according to another additional purpose. According to a feature of the multilayer film structure (rectifying barrier portion 402) with the semiconductor heterojunction in this embodiment, an n-value (ideality factor) indicating whether or not ideal thermionic field emission is performed is close to an ideal value. Thus, the responsibility may be approximated to maximum theoretical responsibility.

In the detector according to each of the first, second, third, and fourth embodiments described above, electrons or holes may be used as the majority carriers. The band profile illustrated in, for example, FIG. 1B is a conduction band profile, and hence the majority carriers are electrons. When the ordinate indicating the energy is inverted for a valence band, a band profile in which the majority carriers are holes is exhibited. In a typical case, it is desirable to select electrons having high mobility because a delay time may be shortened. The delay time may be suppressed to a sufficiently small value depending on a selected semiconductor. For example, an Si system, a GaAs system, an InP system (including InGaAs), an InAs system, or an InSb system may be selected as each of the semiconductors. Of the systems, a later system is desirable because the majority carriers have high mobility and thus the cutoff frequency may be increased. In contrast to this, when the Si system is selected, an amplifier using a complementary metal-oxide semiconductor field-effect transistor (CMOS-FET) or a bipolar complementary metal oxide semiconductor heterojunction bipolar transistor (BiCMOS HBT) may be integrated on the same substrate.

Fifth Embodiment

A detector according to the fifth embodiment of the present invention is described with reference to FIGS. 4A to 4C.

Figure 4A:
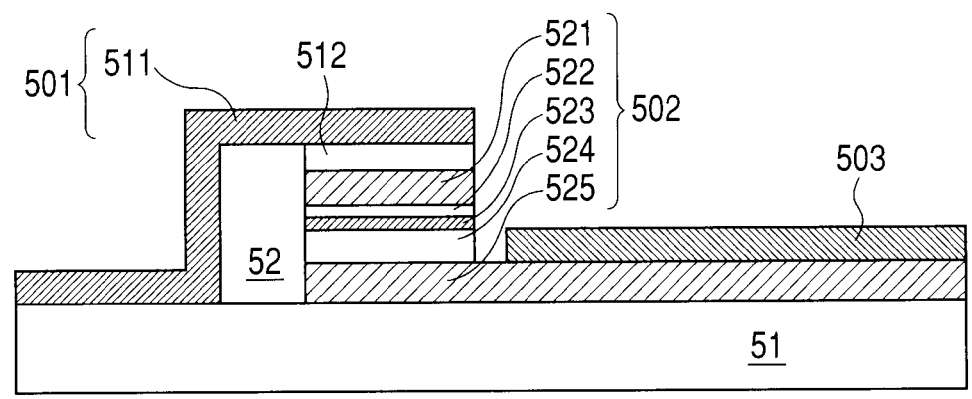
FIGS. 4A, 4B and 4C are structural views illustrating a device according to a fifth embodiment of the present invention.
Figure 4B:
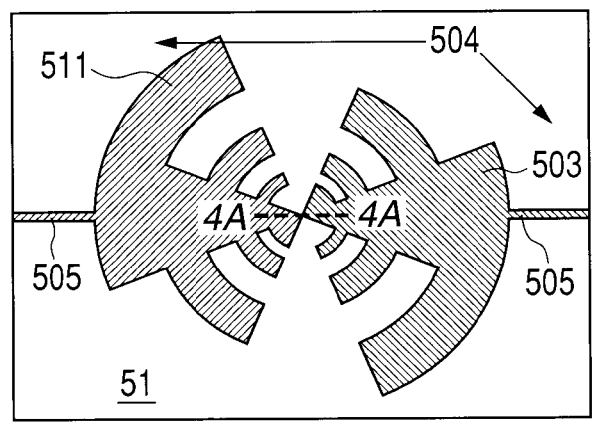
Figure 4C:
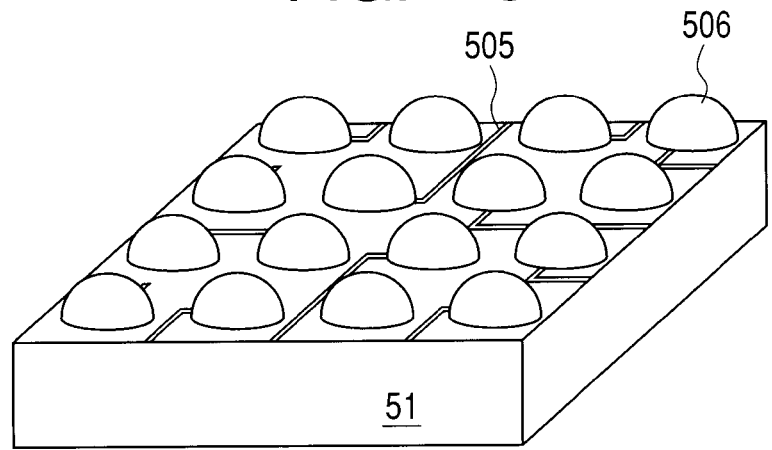

FIGS. 4A to 4C illustrate the detector according to this embodiment. FIG. 4A is a cross sectional view illustrating a part of a structure of the detector, FIG. 4B is a top view illustrating the structure of the detector, and FIG. 4C is a perspective view illustrating an array detector using the detector according to this embodiment. FIG. 4A corresponds to a cross section of 4A-4A of FIG. 4B. In the detector according to this embodiment, a Schottky barrier portion 501 and a rectifying barrier portion 502 are connected so that the same majority carriers continuously pass through the rectifying barrier portion 502 and the Schottky barrier portion 501 when the forward voltage is applied between a Schottky electrode 511 and an ohmic electrode 503. Therefore, the structure of the detector according to this embodiment is regarded as the so-called rectifier and thus may be used as the rectifying type detector.

In FIG. 4A, the detector includes a semiconductor 512 which is substantially intrinsic, a semiconductor 521 having a conductivity type for providing the majority carriers, a semiconductor 522 which is substantially intrinsic, a semiconductor 523 having an opposite conductivity type, a semiconductor 524 which is substantially intrinsic, and a semiconductor 525 having a conductivity type for providing the majority carriers.

In the detector according to this embodiment, in order to induce an electric field component of an electromagnetic wave to be detected, between the Schottky electrode 511 and the ohmic electrode 503, it is simplest to use an antenna 504. The antenna outputs an electric field (voltage) and current of a received electromagnetic wave to output ports. When the frequency band is low, a circuit is normally used in which the output ports are connected to transmission lines to input the voltage and the current to the rectifier. However, in the frequency band ranging from the millimeter wave band to the terahertz wave band (equal to or more than 30 GHz and equal to or less than 30 THz), the transmission lines cause loss and parasitic reactances at connection portions of the transmission lines cannot be neglected.

When the output ports of the antenna 504 are provided corresponding to the two electrodes, the Schottky electrode 511 and the ohmic electrode 503 in the detector according to this embodiment, the influences described above may be removed. Therefore, the rectifier is formed into a mesa shape for isolation and a semi-insulating substrate 51 and a dielectric 52 are used to provide the two electrodes. The mesa shape may be a mesa type or a reverse mesa type. The present invention is not limited to this. The isolation may be performed using well-known ion implantation. When the two electrodes are connected to read wirings 505, a detecting current may be read. The array detector may be used for an image forming device including an image forming portion for forming an electric field distribution image based on changed detecting currents.

In the detector according to this embodiment, for example, a log periodic antenna is used as the antenna 504. The antenna for the detector to which the present invention may be applied can be selected according to another additional purpose. A self-complementary antenna such as the log periodic antenna or a spiral antenna has excellent broadband characteristics and thus is effective as a detector capable of detecting an electromagnetic wave having an extremely wide frequency band. Each of a dipole antenna and a slot antenna which have resonant frequency characteristics is effective as a detector for limiting a received frequency band. There may be a method of improving efficiency in a specific frequency band using an existing microwave technology, such as a method of providing the output ports with stubs.

The control of the frequency band may be used for an application such as color separation (frequency separation). A silicon hemispherical lens 506 as illustrated in FIG. 4C may be provided above an upper surface of the antenna, as a coupling member for improving coupling efficiency with the planar antenna. Alternatively, a horn antenna manufactured by microelectromechanical systems (MEMS) processing may be provided above the upper surface. The detector according to this embodiment as described above is desirable as the detector for the frequency band ranging from the millimeter wave band to the terahertz wave band (equal to or more than 30 GHz and equal to or less than 30 THz).

EXAMPLES

More specific structures are described in the following examples.

Example 1

Figure 5A:
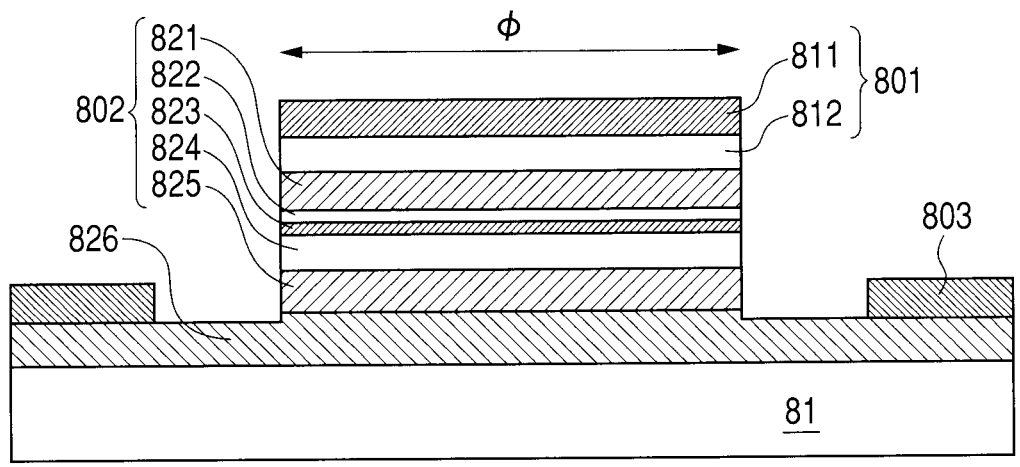
FIG. 5A is a structural view illustrating a device according to Example 1 of the present invention.
Figure 5B:
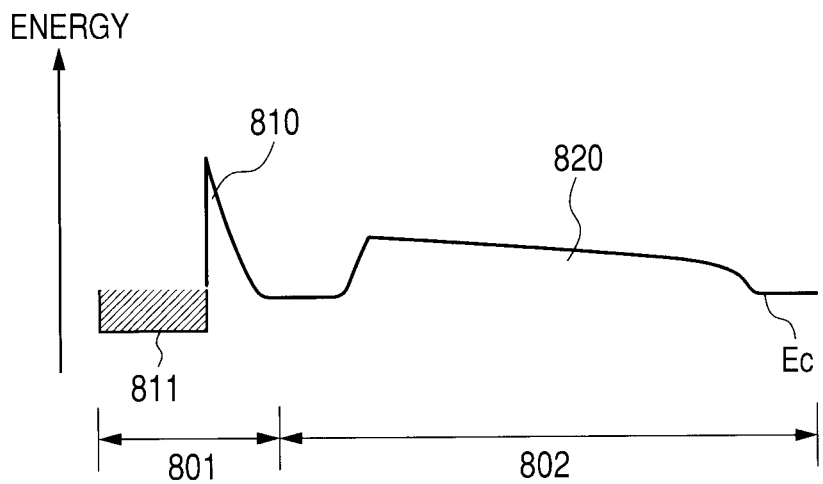
FIG. 5B illustrates a band profile of the device according to Example 1 of the present invention.
Figure 5C:
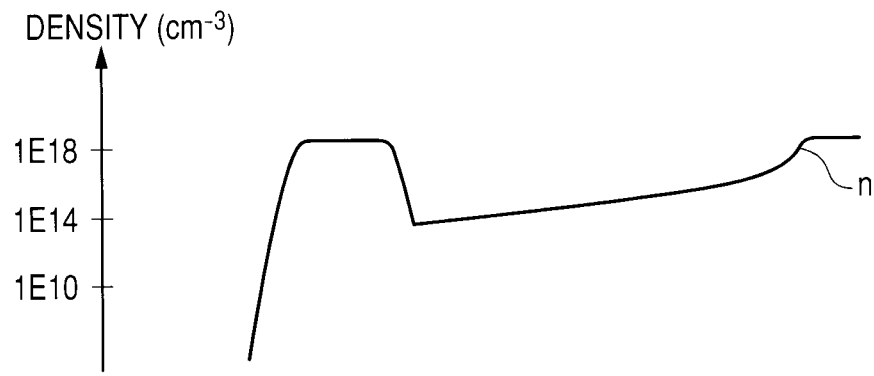
FIG. 5C illustrates a majority carrier concentration distribution of the device according to Example 1 of the present invention.

FIGS. 5A to 5C illustrate a detector according to Example 1. FIG. 5A is a cross sectional view illustrating a structure of the detector, FIG. 5B illustrates a part of a designed band profile in the structure of the detector, and FIG. 5C illustrates a designed electron density distribution in the structure of the detector.

In the detector according to this example, a Schottky barrier portion 801 including a Pt/Au Schottky electrode 811 is connected to a rectifying barrier portion 802 including a GaAs semiconductor multilayer film with a rectifying property with respect to electrons. A Schottky barrier 810 is produced when the Pt/Au Schottky electrode 811 is connected to an n-GaAs layer 812 whose electron density is $2\times10^{18}$ cm$^{-3}$. A state in which the n-GaAs layer 812 is formed of a substantially intrinsic semiconductor may be apparent from the point that, as illustrated in FIG. 5C, the electron density of the n-GaAs layer 812 is sufficiently low and deficient. A thickness of the n-GaAs layer 812 is set to 50 nm so as to be equal to a thickness of a depletion layer. A height of the Schottky barrier 810 is determined based on compatibility of less combination of the Schottky metal (811) and the substantially intrinsic semiconductor (812). In this example, a combination of the Pt layer 811 and the GaAs layer 812 is selected, and hence the height is experimentally known to be approximately 0.8 eV.

A rectifying barrier 820 is produced by the following multilayer film structure. The multilayer film structure includes an n+GaAs layer 821 whose electron density is $3\times10^{18}$ cm$^{-3}$, an undoped GaAs layer 822, a δ-doped p-GaAs layer 823 whose hole sheet density is set to $1\times10^{12}$ cm$^{-2}$ by δ doping, an undoped GaAs layer 824 which is thicker than the undoped GaAs layer 822, and an n+GaAs layer 825 whose electron density is $3\times10^{18}$ cm$^{-3}$, which are provided in the stated order. In a planar doped barrier diode structure, it is known that the hole density of the δ-doped p-GaAs layer 823 determines an energy barrier height. In this example, the design is made so that the height is approximately 0.3 eV.

It is known that a thickness ratio between the undoped GaAs layer 822 and the undoped GaAs layer 824 determines the n-value. It is necessary to make the undoped GaAs layer 824 thicker than the undoped GaAs layer 822. In this example, the design is made so that the n-value is 1.05 in a case of 20 nm: 400 nm. For the supply of carriers, the n+GaAs layers 821 and 825 are sufficiently thickened with a relatively high electron density. In order to reduce a spreading resistance between the n+GaAs layer 825 and an ohmic electrode 803, an n+GaAs layer 826 whose electron density is $1\times10^{19}$ cm$^{-3}$ is further provided. An AuGe/Ni/Au electrode typically used for a GaAs system may be provided as the ohmic electrode 803. When a GaAs substrate 81 is used as a substrate for the Schottky barrier portion 801 and the rectifying barrier portion 802, lattice matching is achieved. For example, thicknesses of the respective semiconductor layers are as illustrated in Table 1. In Table 1, for example, 2E17 indicates $2\times10^{17}$.

TABLE 1

| | GROUP | REP. | MOLE (%) | THICKNESS (nm) | DOPANT | CONC. | UNIT |
|---|---|---|---|---|---|---|---|
| n−GaAs 812 | 1 | 1 | — | 50 | Si | 2E17 | cm$^{-3}$ |
| n+GaAs 821 | | | — | 100 | Si | 3E18 | cm$^{-3}$ |
| i−GaAs 822 | | | — | 20 | — | — | |
| δ-doped p−GaAs 823 | 2 | 1 | — | <2 | Be | 1E12 | cm$^{-2}$ |
| i−GaAs 824 | | | — | 400 | — | — | |
| n+GaAs 825 | | | — | 100 | Si | 3E18 | cm$^{-3}$ |
| n+GaAs 826 | 3 | 1 | — | 400 | Si | 1E19 | cm$^{-3}$ |
| GaAs Sub. 81 | | | | | | | |

Figure 6A:
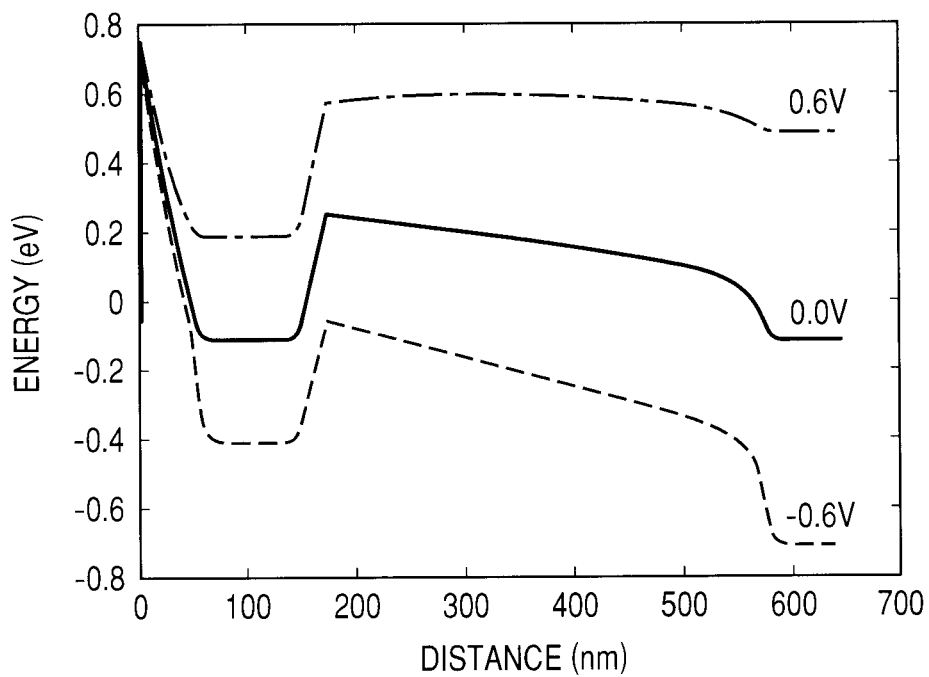
FIG. 6A illustrates relationships with electric fields (voltages) applied in the band profile of the device according to Example 1.

A band profile in a case where an electric field is applied to the detector according to this example is as illustrated in FIG. 6A. A band edge Ec is plotted relative to Fermi energy of the Schottky electrode 811. An electric field is normally shared between the Schottky barrier portion 801 and the rectifying barrier portion 802. In other words, when a voltage is expressed by V, $V=V_{801}+V_{802}$. When the Schottky barrier portion 801 is connected to a short-circuit load, short-circuit current responsibility is expressed by $(d^2I/dV_{801}^2)/(2\times dI/dV_{801})$. Similarly, When the rectifying barrier portion 802 is connected to a short-circuit load, short-circuit current responsibility is expressed by $(d^2I/dV_{802}^2)/(2\times dI/dV_{802})$. When the short-circuit current responsibilities are assumed to be expressed by $S_{I801}$ and $S_{I802}$, voltage responsibility $S_V(V)$ of the entire detector is estimated using $S_V(V)=dR(V)(S_{I801}(V_{801})+S_{I802}(V_{802}))$, where dR(V) indicates a differential resistance of the entire detector at the voltage V. The voltage responsibility is assumed to be $dR(V)(S_{I801}((1-\alpha)V)+S_{I802}(\alpha V))$ $(0<\alpha<1)$.

The short-circuit current responsibilities $S_{I801}$ and $S_{I802}$ are experimentally maximum at vicinities of the forward voltage which correspond to respective barrier heights. In the detector according to this example, $S_{I801}$ is maximum at the vicinity of $V=(0.8/(1-\alpha))$ [V] and $S_{I802}$ ($V_{802}$) is maximum at the vicinity of $V=(0.3/\alpha)$ [V]. Examples of the relationships are illustrated in FIGS. 7A and 7B. In FIGS. 7A and 7B, $V_{801}$ and $V_{802}$ have approximately the same order between 0.0 [V] and the vicinity of $(0.3/\alpha)$ [V], and hence α>0.5 in the forward voltage range. Note that $V=(0.3/\alpha)$ [V] normally indicates a turn-on voltage in a lower barrier which is first turned on. After the vicinity of $V=(0.3/\alpha)$ [V], $V_{801}$ is sufficiently larger than $V_{802}$, and hence α<0.1 in the forward voltage range. As illustrated in FIG. 7B, the voltage responsibility $S_V(V)$ is a combination of the responsibilities in the Schottky barrier portion 801 and the rectifying barrier portion 802. Therefore, the detector has maximum voltage responsibility at the vicinity of $V=(0.3/\alpha)$ [V]. In addition to this, the detector according to this example has responsibility at the vicinity of zero bias because of the responsibility in the rectifying barrier portion 802.

Figure 8A:
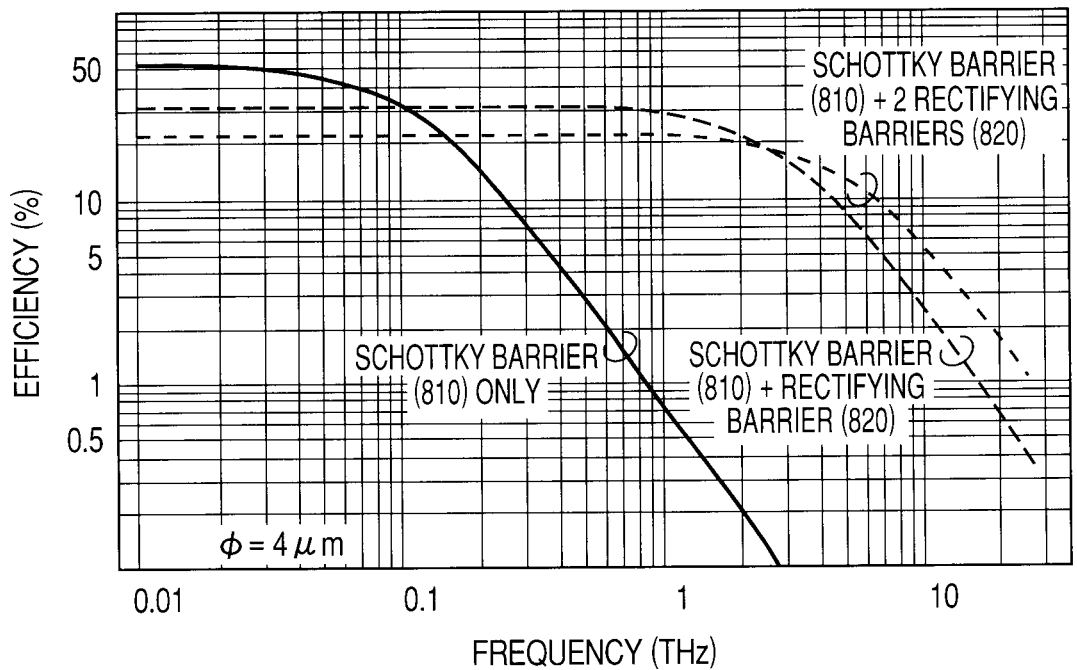
FIGS. 8A and 8B illustrate results obtained by comparing frequency dependences of efficiency and noise equivalent power (NEP) as detection performance of the device according to Example 1 and frequency dependences of efficiency and NEP as detection performance of a conventional Schottky barrier diode.
Figure 8B:
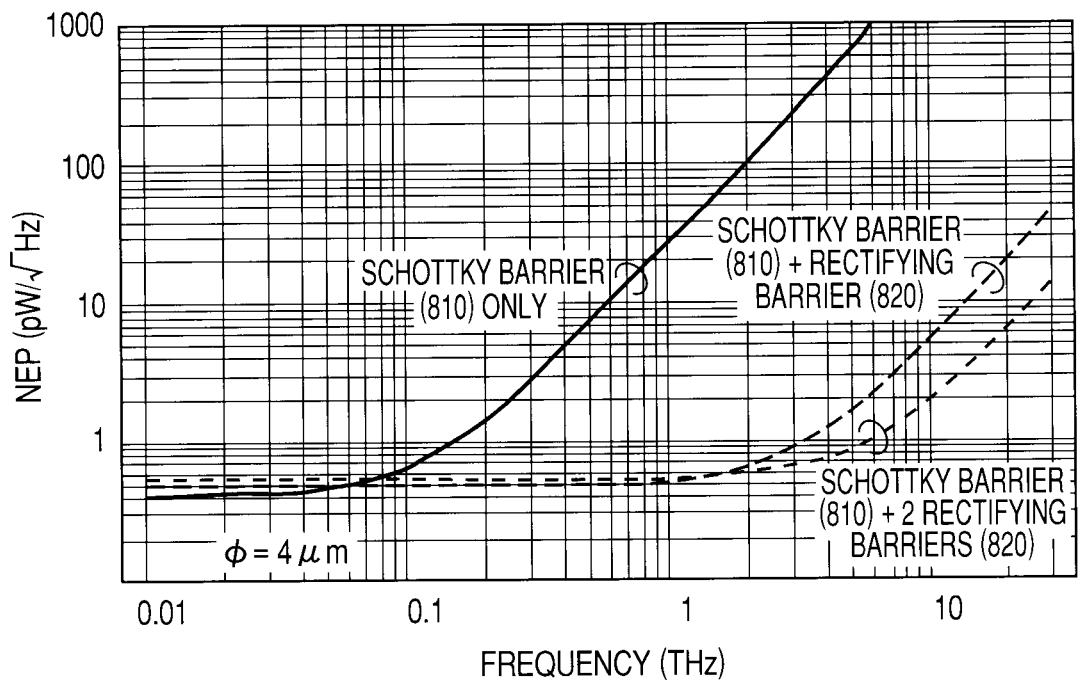

An RC first-order low-pass filter of the detector according to this example has a junction capacitance $Cj_{810}$ in the Schottky barrier 810, a junction capacitance $Cj_{820}$ in the rectifying barrier 820, and a series resistance Rs. According to a band design, $Cj_{810}$ is approximately 2 fF/μm$^2$ (depletion layer of approximately 50 nm) and $Cj_{820}$ is approximately 0.3 fF/μm$^2$ (depletion layer of approximately 400 nm). FIGS. 8A and 8B are graphs obtained by plotting efficiency and NEP of the detector according to this example in a case where the Schottky electrode has a diameter Φ of 4 μm. The efficiency is a ratio at which power of an electromagnetic wave to be detected is input to the rectifier in a case where an electric field component of the electromagnetic wave is induced between the Schottky electrode 811 and the ohmic electrode 803 through the antenna. When the efficiency is calculated, the antenna is assumed to be a log periodic antenna and an impedance of 188Ω is set. As is apparent from FIG. 8A, the efficiency of the detector according to this example in a high-frequency side is more excellent than in a comparative structure using only the Schottky barrier 810. As is apparent from FIG. 8B, in the high-frequency side, the NEP in which efficiency and Johnson noise at room temperature are taken into account is also more excellent than in the comparative structure using only the Schottky barrier 810. The results correspond to the effect of reducing RsCj of the entire detector to increase the cutoff frequency.

Figure 8C:
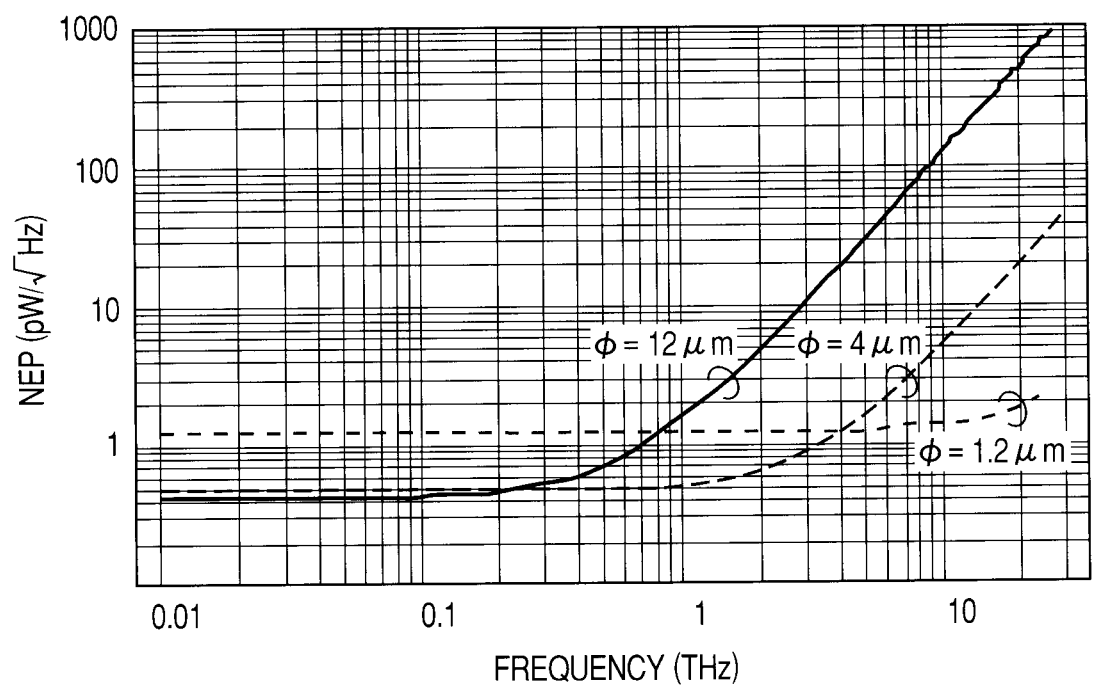
FIG. 8C illustrates relationships between detection performance of the device according to Example 1 and Schottky electrode diameters Φ.

A modified example of this example illustrates a case where the number of rectifying barrier portions 802 is two (the number of repetitions (REP.) of group GROUP2 in Table 1 is two). This example illustrates the case where the Schottky electrode has the diameter Φ of 4 μm. When the diameter of the Schottky electrode is reduced, the cutoff frequency increases as in the case of the conventional Schottky diode. For example, relationships in cases where Φ=12 μm, Φ=4 μm, and Φ=1.2 μm are illustrated in FIG. 8C. The spreading resistance dominant over the series resistance may be 0.8Ω in Φ=12 μm, 1.6Ω in Φ=4 μm, and 3.1Ω in Φ=1.2 μm. The resistance of the epitaxial layer of the detector according to this example is smaller than the spreading resistance by one order. The diameter Φ is desirably selected based on the frequency band of the electromagnetic wave. In the frequency band of up to 100 GHz, Φ=12 μm (approximately 100 μm$^2$ in area) is desirably selected. In the frequency band from 100 GHz to 1 THz, Φ=4 μm (approximately 10 μm$^2$ in area) is desirably selected. In the frequency band from 1 THz to 10 THz, Φ=1.2 μm (approximately 1 μm$^2$ in area) is desirably selected.

The detector according to this example may be manufactured by the following manufacturing method. The following layer is epitaxially grown on the semi-insulating GaAs substrate 81 by a molecular beam epitaxy (MBE) method or a metalorganic vapor phase epitaxy (MOVPE) method. That is, the n+GaAs layer 826, the n+GaAs layer 825, the undoped GaAs layer 824, the δ-doped p-GaAs layer 823, the undoped GaAs layer 822, the n+GaAs layer 821, and the n-GaAs layer 812 are epitaxially grown in the stated order. Then, the Pt/Au layer serving as the Schottky electrode 811 is formed on the surface by vapor deposition and etched into, for example, a mesa shape with Φ=4 μm. The etching includes photolithography and inductively coupled plasma (ICP) dry etching.

The AuGe/Ni/Au layer serving as the ohmic electrode 803 is formed on the exposed n+GaAs layer 826 by a lift-off method, to obtain the structure described above. The AuGe/Ni/Au layer may be formed and then the AuGe/Ni/Au layer and the GaAs layer may be successively etched into the mesa shape. The manufacturing method using photolithography as described above is suitable for mass production and thus desirable to manufacture the detector to which the present invention may be applied. When the Schottky electrode 811 is to be formed, for example, a chemical vapor deposition (CVD) method or a sputtering method may be selected.

ing property with respect to electrons. Like the other examples, The rectifying barrier portion 1302 includes a conductivity type semiconductor 1321 for providing the majority carriers, a semiconductor 1322 which is substantially intrinsic, a semiconductor 1323 having an opposite conductivity type, a semiconductor 1324 which is substantially intrinsic, and a conductivity type semiconductor 1325 for providing the majority carriers. A height of a Schottky barrier 1310 is determined based on compatibility of less combination of the Schottky metal (1311) and a substantially intrinsic semiconductor (1312). In this example, a combination of the Al layer 1311 and the InGaAs layer 1312 is selected, and hence a relatively low barrier height of approximately 0.2 eV is set. A rectifying barrier 1320 is produced so that a barrier height thereof is set to approximately 0.1 eV by the multilayer film structure.

When the low barrier height is designed, the suitable operating point of responsibility may be set to zero bias. This is also apparent from the fact that a shot noise (∝I), a 1/f noise (∝I/f), and a burst noise (∝I/(1+f/fn)) which are noise components of a Schottky barrier diode depend on a current I flowing through a rectifier. Note that fn indicates a frequency called a noise corner, which is typically approximately 10 kHz. In other words, the zero bias operation requires no bias current, and hence the noises may be reduced. A bias wiring for the detector may be omitted. Therefore, necessary wirings may be only detecting current read wirings. This is convenient to simplify the structure, for example, when a large-scale array is used.

When an InP substrate 131 is used as a substrate for the Schottky barrier portion 1301 and the rectifying barrier portion 1302, lattice matching is achieved. For example, thicknesses of the respective semiconductor layers are as illustrated in Table 2. A Ti/Pt/Au electrode which is a typical non-alloy electrode may be used as an ohmic electrode 1303 because an n+InGaAs layer 1326 whose electron density is $1\times10^{19}$ cm$^{-3}$ is provided.

TABLE 2

| | GROUP | REP. | MOLE (%) | THICKNESS (nm) | DOPANT | CONC. | UNIT |
|---|---|---|---|---|---|---|---|
| n–InGaAs 1312 | 1 | 1 | 53 | 30 | Si | 1E18 | cm$^{-3}$ |
| n+InGaAs 1321 | | | 53 | 100 | Si | 2E18 | cm$^{-3}$ |
| i–InGaAs 1322 | | | 53 | 10 | Si | 1E16 | cm$^{-3}$ |
| δ-doped p–InGaAs 1323 | 2 | 1 | 53 | <2 | C | 1.2E12 | cm$^{-2}$ |
| n–InGaAs 1324 | | | 53 | 200 | Si | 1E16 | cm$^{-3}$ |
| n+InGaAs 1325 | | | 53 | 100 | Si | 2E18 | cm$^{-3}$ |
| n+InGaAs 1326 InP Sub. 131 | 3 | 1 | 53 | 400 | Si | 1E19 | cm$^{-3}$ |

According to this example, the operations and effects as described in the embodiments can be obtained.

Example 2

Figure 9A:
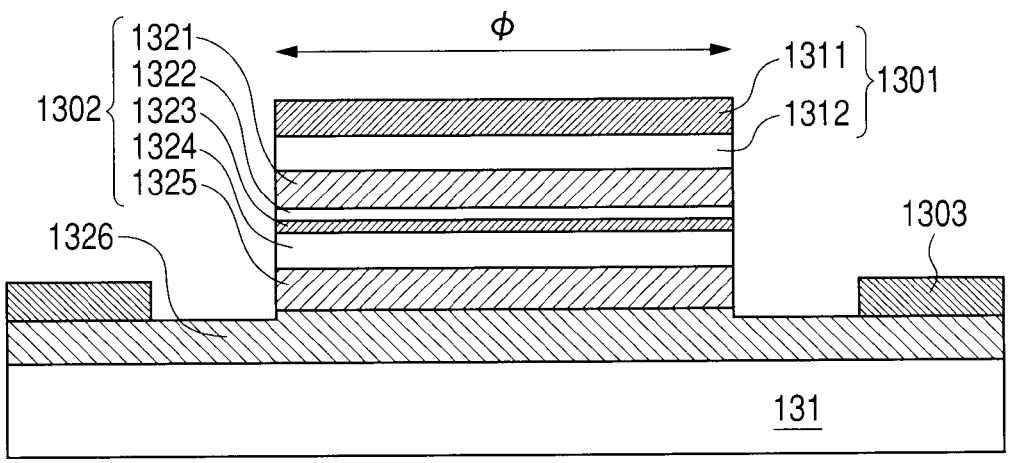
FIG. 9A is a structural view illustrating a device according to Example 2 of the present invention.
Figure 9B:
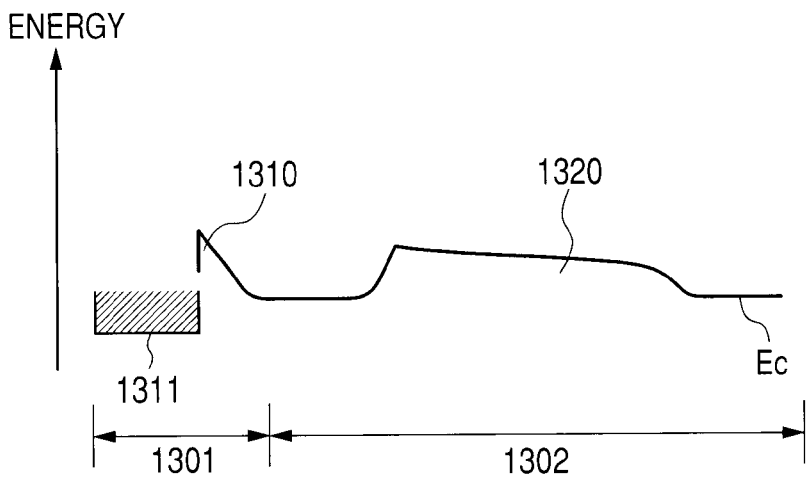
FIG. 9B illustrates a band profile of the device according to Example 2 of the present invention.
Figure 9C:
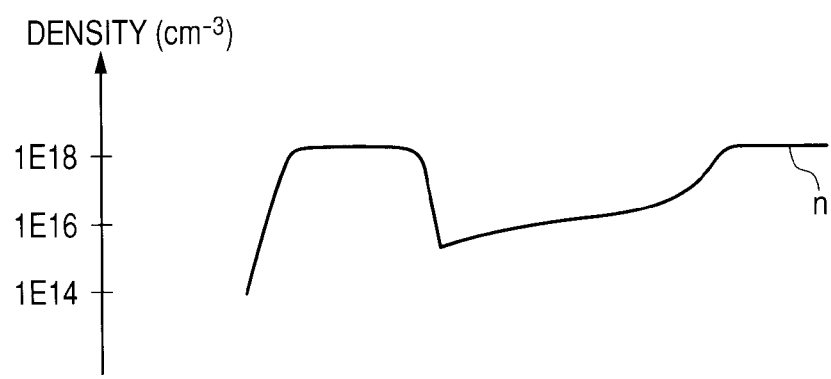
FIG. 9C illustrates a majority carrier concentration distribution of the device according to Example 2 of the present invention.

FIGS. 9A to 9C illustrate a detector according to Example 2. FIG. 9A is a cross sectional view illustrating a structure of the detector, FIG. 9B illustrates a part of a designed band profile in the structure of the detector, and FIG. 9C illustrates a designed electron density distribution in the structure of the detector.

Figure 6B:
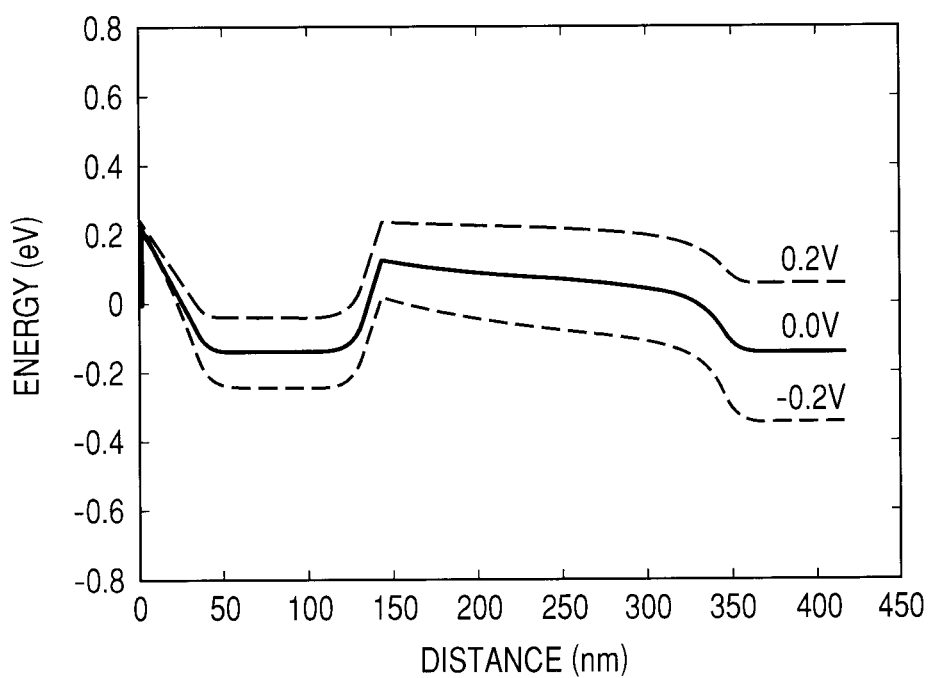
FIG. 6B illustrates relationships with electric fields (voltages) applied in a band profile of a device according to Example 2.
Figure 10A:
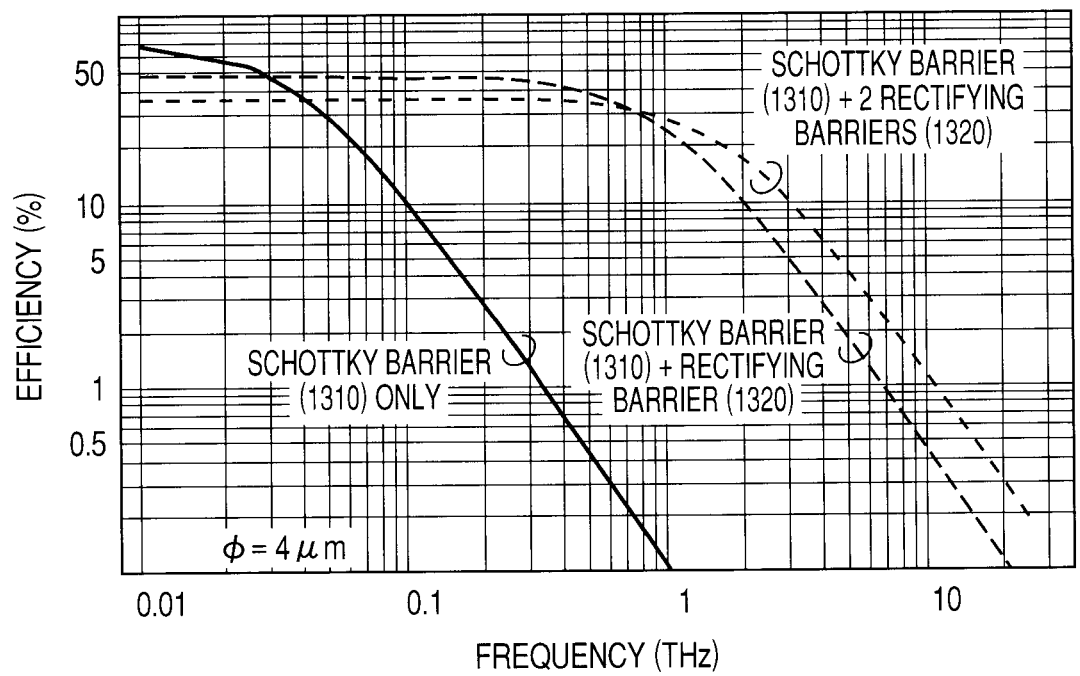
FIGS. 10A and 10B illustrate results obtained by comparing frequency dependences of efficiency and noise equivalent power (NEP) as detection performance of the device according to Example 2 and frequency dependences of efficiency and NEP as detection performance of the conventional Schottky barrier diode.
Figure 10B:
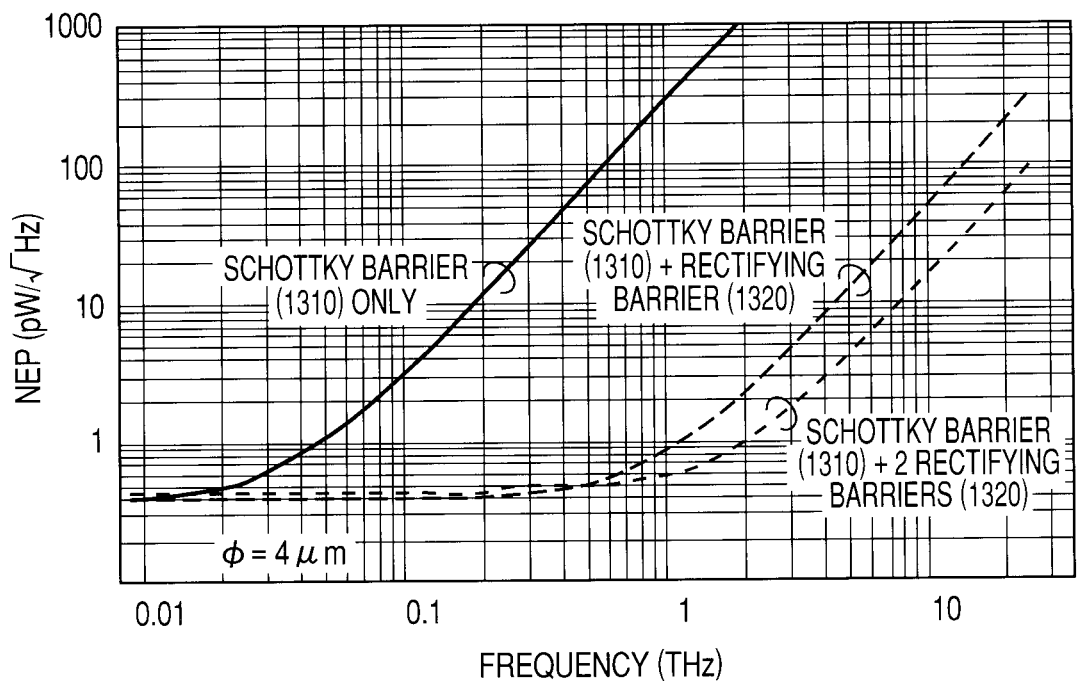

In the detector according to this example, a Schottky barrier portion 1301 including a Schottky electrode (Al layer) 1311 is connected to a rectifying barrier portion 1302 including an InGaAs semiconductor multilayer film with a rectify- A band profile in a case where an electric field is applied to the detector according to this example is as illustrated in FIG. 6B. FIGS. 10A and 10B are graphs obtained by plotting efficiency and NEP of the detector according to this example in a case where the Schottky electrode has a diameter Φ of 4 μm. The results exactly correspond to the effect of reducing RsCj of the entire detector to increase the cutoff frequency, and hence the effect is not lost in design for the zero bias operation. A modified example of this example in a case where the number of rectifying barrier portions 1302 is two (the number of repetitions (REP.) of group GROUP2 in Table 2 is two) is also plotted in FIGS. 10A and 10B.

Even in this example, the operations and effects as described in the embodiments can be obtained.

Example 3

Figure 11A:
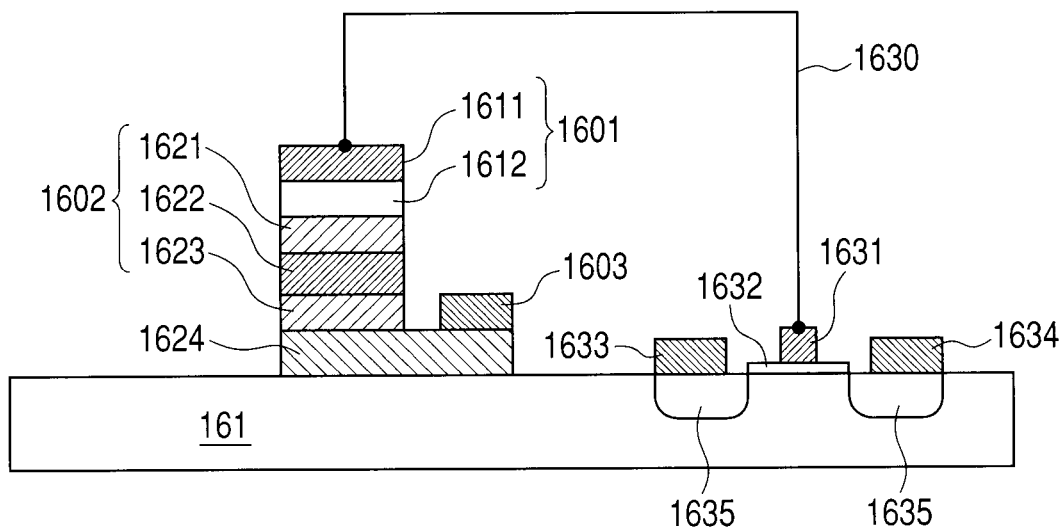
FIG. 11A is a structural view illustrating a device according to Example 3 of the present invention.
Figure 11B:
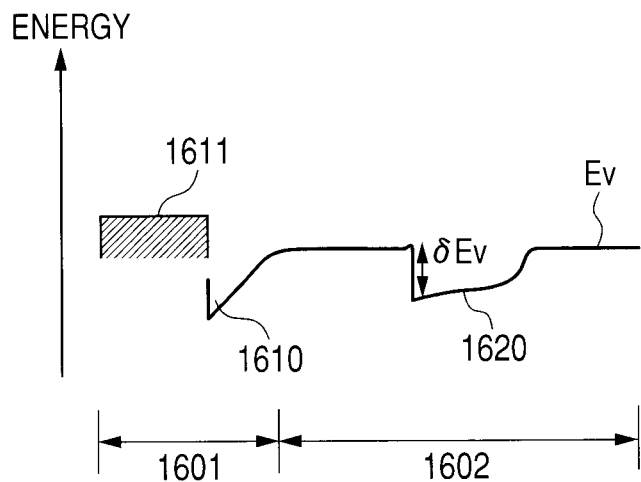
FIG. 11B illustrates a band profile of the device according to Example 3 of the present invention.
Figure 11C:
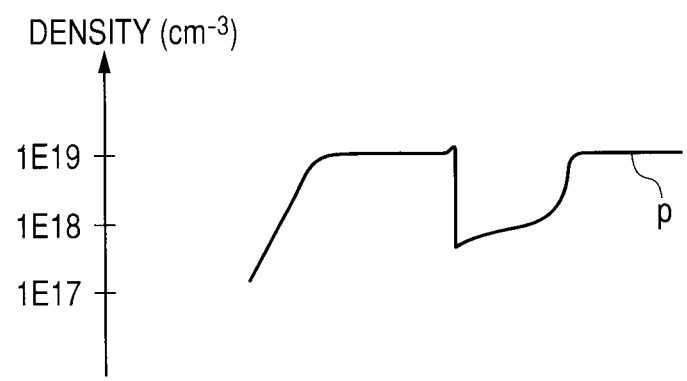
FIG. 11C illustrates a majority carrier concentration distribution of the device according to Example 3 of the present invention.

FIGS. 11A to 11C illustrates a detector according to Example 3. FIG. 11A is a cross sectional view illustrating a structure of the detector, FIG. 11B illustrates a part of a designed band profile in the structure of the detector, and FIG. 11C illustrates a designed hole density distribution in the structure of the detector.

In the detector according to this example, a Schottky barrier portion 1601 including a Pd/Au Schottky electrode 1611 is connected to a rectifying barrier portion 1602 having an Si semiconductor heterojunction with a rectifying property with respect to holes. In this example, a Si/SiGe film including a Si layer and a distorted SiGe layer are selected for the rectifying barrier portion 1602. However, the present invention is not limited to this. A Si/SiGe film including a distorted Si layer and a relaxed SiGe layer may also be selected.

A Si substrate 161 is used as a substrate for the Schottky barrier portion 1601 and the rectifying barrier portion 1602. The design is made so that a composition of SiGe is $Si_{0.09}Ge_{0.10}$ and δEv is approximately 0.07 eV. Thicknesses or the like of the respective semiconductor layers structured as described above are as illustrated in Table 3.

TABLE 3

| | MOLE (%) | THICKNESS (nm) | DOPANT | CONC. | UNIT |
|---|---|---|---|---|---|
| p−SiGe 1612 | 10 | 20 | B | 1E18 | $cm^{-3}$ |
| p+SiGe 1621 | 10 | 50 | B | 1E19 | $cm^{-3}$ |
| p−Si 1622 | | 40 | B | 1E17 | $cm^{-3}$ |
| p+Si 1623 | | 100 | B | 1E19 | $cm^{-3}$ |
| p+Si 1624 | | 400 | B | 5E19 | $cm^{-3}$ |
| Si Sub. 161 | | | | | |

In this example, a detecting signal may be amplified by a metal-oxide semiconductor field-effect transistor (MOSFET) which is integrated on the same Si substrate 161 and includes a gate insulating layer 1632 and source and drain regions 1635. Therefore, the Schottky electrode 1611 is connected to a wiring 1630 so that the detecting signal is input to a gate electrode 1631 of the MOSFET. Whether an ohmic electrode 1603 is connected to a source electrode 1633 to realize a well-known common source or the ohmic electrode 1603 is connected to a drain electrode 1634 to form a well-known source follower is selected according to a purpose. In this case, a voltage obtained through conversion from a detecting current by the differential resistance dR of the entire detector is input as the detecting signal to the MOSFET. The detecting signal from the MOSFET is output from a remaining electrode which is not connected to the Schottky electrode 1611 and the ohmic electrode 1603. The structure in which the MOSFET is provided as the amplifier for the detector on the same substrate as described above is low in cost because the structure may be manufactured using a standard CMOS process. A noise mixed with the detecting signal becomes smaller as the wiring 1630 shortens. Therefore, it is convenient to integrate the MOSFET on the same substrate as described above in view of reducing noise figure (NF).

Even in this Example, the operations and effects as described in the embodiments can be obtained. That is, each of a Schottky barrier 1610 and a rectifying barrier 1620 with the height δEv has an asymmetrical band profile whose one side is a steep gradient and the other side is a gentle gradient, and the steep gradient side is located on the Schottky electrode 1611 side.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-203089, filed Aug. 6, 2008, and Japanese Patent Application No. 2009-154447, filed Jun. 30, 2009, which are hereby incorporated by reference herein in their entirety.

The invention claimed is:

1. A detector, comprising:
a Schottky barrier portion including a Schottky electrode;
a barrier portion having a rectifying property with respect to a majority carrier in the Schottky barrier portion; and
an ohmic electrode which is in electrical contact with the barrier portion having the rectifying property, wherein:
each of the Schottky barrier portion and the barrier portion having the rectifying property has an asymmetrical band profile whose gradient on one side is larger than a gradient of another side; and
the Schottky barrier portion and the barrier portion having the rectifying property are connected to each other via only a conductive portion providing the majority carrier so that the one side being the large gradient of the band profile is located on a side of the Schottky electrode.

2. The detector according to claim 1, wherein the Schottky barrier portion is connected to the barrier portion having the rectifying property so that the same majority carriers pass through the barrier portion having the rectifying property and the Schottky barrier portion when an electric field component of an electromagnetic wave to be detected is induced between the Schottky electrode and the ohmic electrode.

3. The detector according to claim 2, further comprising a plurality of the barrier portions having the rectifying property, wherein the plurality of barrier portions having the rectifying property are connected.

4. The detector according to claim 2, wherein the Schottky barrier portion comprises, in order from the Schottky electrode, one of a metal and a semi-metal forming the Schottky electrode and one of an intrinsic semiconductor and a substantially intrinsic semiconductor which are capable of depleting the majority carrier.

5. The detector according to claim 2, wherein the majority carrier comprises an electron.

6. The detector according to claim 2, further comprising a transistor for generating a detecting signal,
wherein the detector and the transistor are provided on the same substrate.

7. The detector according to claim 2, further comprising an antenna for inducing, between the Schottky electrode and the ohmic electrode, an electric field component of the electromagnetic wave to be detected,
wherein the Schottky electrode and the ohmic electrode are provided as output ports of the antenna.

8. An image forming device, comprising:
a plurality of detectors according to claim 1, wherein:
the plurality of detectors are arranged in array; and
the plurality of detectors detect electric fields of electromagnetic waves, based on which an electric field distribution image is formed.

9. A detector, comprising:
a Schottky barrier portion including a Schottky electrode;
a barrier portion having a rectifying property with respect to a majority carrier in the Schottky barrier portion; and an ohmic electrode which is in electrical contact with the barrier portion having the rectifying property, wherein each of the Schottky barrier portion and the barrier portion having the rectifying property has an asymmetrical band profile whose gradient on one side is larger than a gradient of another side, wherein the Schottky barrier portion and the barrier portion having the rectifying property are connected to each other via a conductive portion providing the majority carrier so that the one side being the large gradient of the band profile is located on a side of the Schottky electrode, wherein the Schottky barrier portion is connected to the barrier portion having the rectifying property so that the same majority carriers pass through the barrier portion having the rectifying property and the Schottky barrier portion when an electric field component of an electromagnetic wave to be detected is induced between the Schottky electrode and the ohmic electrode, wherein the Schottky barrier portion comprises, in order from the Schottky electrode, one of a metal and a semi-metal forming the Schottky electrode and one of an intrinsic semiconductor and a substantially intrinsic semiconductor which are capable of depleting the majority carrier, and wherein the barrier portion having the rectifying property includes a multilayer film structure in which a semiconductor having a conductivity type for providing the majority carrier, one of an intrinsic semiconductor and a substantially intrinsic semiconductor which are capable of depleting the majority carrier, a semiconductor opposite in conductivity to the semiconductor having the conductivity type, one of another intrinsic semiconductor and another substantially intrinsic semiconductor which are capable of depleting the majority carrier and thicker than the one of the intrinsic semiconductor and the substantially intrinsic semiconductor, and another semiconductor having the conductivity type for providing the majority carrier, are provided in order from the Schottky electrode.

10. A detector, comprising:
a Schottky barrier portion including a Schottky electrode;
a barrier portion having a rectifying property with respect to a majority carrier in the Schottky barrier portion; and
an ohmic electrode which is in electrical contact with the barrier portion having the rectifying property, wherein each of the Schottky barrier portion and the barrier portion having the rectifying property has an asymmetrical band profile whose gradient on one side is larger than a gradient of another side, wherein the Schottky barrier portion and the barrier portion having the rectifying property are connected to each other via a conductive portion providing the majority carrier so that the one side being the large gradient of the band profile is located on a side of the Schottky electrode, wherein the Schottky barrier portion is connected to the barrier portion having the rectifying property so that the same majority carriers pass through the barrier portion having the rectifying property and the Schottky barrier portion when an electric field component of an electromagnetic wave to be detected is induced between the Schottky electrode and the ohmic electrode, wherein the Schottky barrier portion comprises, in order from the Schottky electrode, one of a metal and a semi-metal forming the Schottky electrode and one of an intrinsic semiconductor and a substantially intrinsic semiconductor which are capable of depleting the majority carrier, and wherein the barrier portion having the rectifying property includes a multilayer film structure in which a semiconductor having a conductivity type for providing the majority carrier, a semi-metal, one of an intrinsic semiconductor and a substantially intrinsic semiconductor which are capable of depleting the majority carrier, and another semiconductor having the conductivity type for providing the majority carrier, are provided in order from the Schottky electrode.

11. A detector, comprising:
a Schottky barrier portion including a Schottky electrode;
a barrier portion having a rectifying property with respect to a majority carrier in the Schottky barrier portion; and
an ohmic electrode which is in electrical contact with the barrier portion having the rectifying property, wherein each of the Schottky barrier portion and the barrier portion having the rectifying property has an asymmetrical band profile whose gradient on one side is larger than a gradient of another side, wherein the Schottky barrier portion and the barrier portion having the rectifying property are connected to each other via a conductive portion providing the majority carrier so that the one side being the large gradient of the band profile is located on a side of the Schottky electrode, wherein the Schottky barrier portion is connected to the barrier portion having the rectifying property so that the same majority carriers pass through the barrier portion having the rectifying property and the Schottky barrier portion when an electric field component of an electromagnetic wave to be detected is induced between the Schottky electrode and the ohmic electrode, wherein the Schottky barrier portion comprises, in order from the Schottky electrode, one of a metal and a semi-metal forming the Schottky electrode and one of an intrinsic semiconductor and a substantially intrinsic semiconductor which are capable of depleting the majority carrier, and wherein the barrier portion having the rectifying property includes a multilayer film structure in which a semiconductor having a conductivity type for providing the majority carrier, one of an intrinsic semiconductor and a substantially intrinsic semiconductor which have a larger band gap than the semiconductor having the conductivity type and are capable of depleting the majority carrier, and another semiconductor having the conductivity type for providing the majority carrier, are provided in order from the Schottky electrode.

* * * * *